(12) United States Patent
Muto et al.

(10) Patent No.: US 9,838,637 B2
(45) Date of Patent: Dec. 5, 2017

(54) SOLID-STATE IMAGE SENSOR, METHOD OF CONTROLLING THE SAME, IMAGE SENSING SYSTEM, AND CAMERA

(71) Applicant: CANON KABUSHIKI KAISHA, Tokyo (JP)

(72) Inventors: Takashi Muto, Kawasaki (JP); Yasushi Matsuno, Fujisawa (JP); Daisuke Yoshida, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/277,168

(22) Filed: Sep. 27, 2016

(65) Prior Publication Data
US 2017/0118428 A1 Apr. 27, 2017

(30) Foreign Application Priority Data

Oct. 21, 2015 (JP) .................................. 2015-207496
Aug. 24, 2016 (JP) .................................. 2016-164065

(51) Int. Cl.
*H04N 3/14* (2006.01)
*H04N 5/335* (2011.01)
(Continued)

(52) U.S. Cl.
CPC ....... *H04N 5/378* (2013.01); *H01L 27/14634* (2013.01); *H04N 5/3651* (2013.01); *H04N 5/3658* (2013.01)

(58) Field of Classification Search
CPC ...... H04N 5/378; H04N 5/3575; H04N 5/243; H04N 5/37455; H04N 5/37457;
(Continued)

(56) References Cited

U.S. PATENT DOCUMENTS 7,382,298 B1 * 6/2008 Bucklen .............. H03M 1/1028
341/118
7,456,876 B2 * 11/2008 Funakoshi ............. H04N 5/361
348/222.1

(Continued)

FOREIGN PATENT DOCUMENTS

JP 2005-175517 A 6/2005
JP 2014-131147 A 7/2014

OTHER PUBLICATIONS

Takashi Muto, et al., U.S. Appl. No. 15/084,043, filed Mar. 29, 2016.

(Continued)

*Primary Examiner* — Chia-Wei A Chen
(74) *Attorney, Agent, or Firm* — Fitzpatrick, Cella, Harper & Scinto

(57) ABSTRACT

A solid-state image sensor includes a pixel configured to generate a pixel signal corresponding to incident light, an amplification circuit configured to amplify the pixel signal, a setting circuit configured to set a gain of the amplification circuit based on a comparison result between a threshold and the pixel signal amplified by the amplification circuit, and a correction circuit configured to correct the pixel signal, which is amplified by a gain set by the setting circuit, by using a first correction value and a second correction value. The first correction value is a value corresponding to a gain error and the second correction value is a value corresponding to an offset of the amplification circuit in the gain.

20 Claims, 16 Drawing Sheets

(51) Int. Cl.
*H04N 5/378* (2011.01)
*H01L 27/146* (2006.01)
*H04N 5/365* (2011.01)

(58) Field of Classification Search
CPC ..... H04N 5/3745; H04N 5/3658; H03M 1/56; H03M 1/1023
USPC .................................................. 348/300–302
See application file for complete search history.

(56) References Cited

U.S. PATENT DOCUMENTS

| | | | |
|---|---|---|---|
| 7,830,436 B2 | 11/2010 | Sumi et al. | |
| 8,400,546 B2 | 3/2013 | Itano et al. | |
| 8,698,062 B2 | 4/2014 | Yoshida | |
| 8,711,261 B2 | 4/2014 | Sumi et al. | |
| 8,945,472 B2* | 2/2015 | Kahlman | G01N 21/274 422/400 |
| 9,088,741 B2 | 7/2015 | Sumi et al. | |
| 9,159,750 B2 | 10/2015 | Ikeda et al. | |
| 9,350,958 B2 | 5/2016 | Totsuka et al. | |
| 9,407,839 B2 | 8/2016 | Yoshida | |
| 2009/0304275 A1* | 12/2009 | Kodavalla | G06T 5/009 382/167 |
| 2013/0162874 A1* | 6/2013 | Hashimoto | H04N 5/243 348/300 |
| 2014/0184844 A1 | 7/2014 | Muto et al. | |
| 2014/0185762 A1* | 7/2014 | Lee | G01N 23/04 378/62 |
| 2014/0333816 A1* | 11/2014 | Uchida | H04N 5/37455 348/308 |
| 2015/0281614 A1 | 10/2015 | Yoshida et al. | |
| 2015/0281616 A1 | 10/2015 | Muto et al. | |
| 2015/0319380 A1 | 11/2015 | Yoshida | |
| 2015/0365616 A1 | 12/2015 | Yoshida | |
| 2016/0238454 A1* | 8/2016 | Pillans | G01J 5/524 |
| 2017/0099446 A1* | 4/2017 | Cremers | H04N 5/3559 |
| 2017/0201693 A1* | 7/2017 | Sugizaki | H04N 5/243 |
| 2017/0223317 A1* | 8/2017 | Matsumoto | H04N 9/045 348/294 |
| 2017/0230597 A1* | 8/2017 | Fahim | H04N 5/378 |

OTHER PUBLICATIONS

Hirofumi Totsuka, et al., U.S. Appl. No. 15/235,679, filed Aug. 12, 2016.

Hirofumi Totsuka, et al., U.S. Appl. No. 15/257,549, filed Sep. 6, 2016.

* cited by examiner

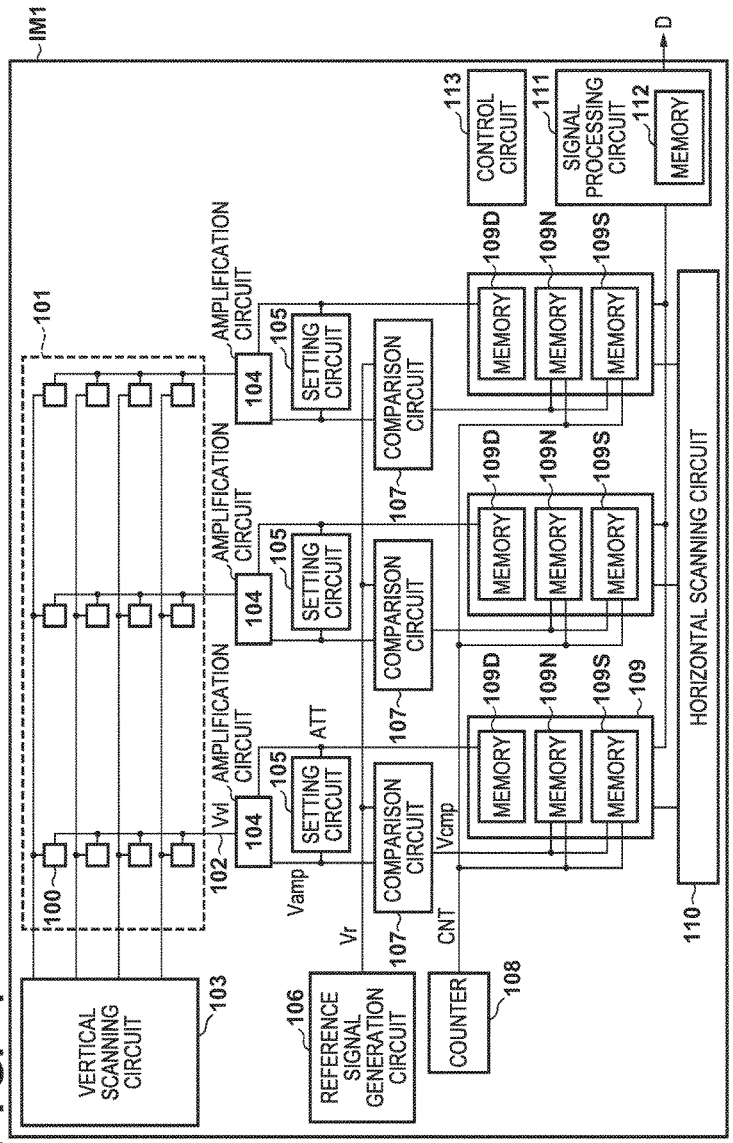

F I G. 14
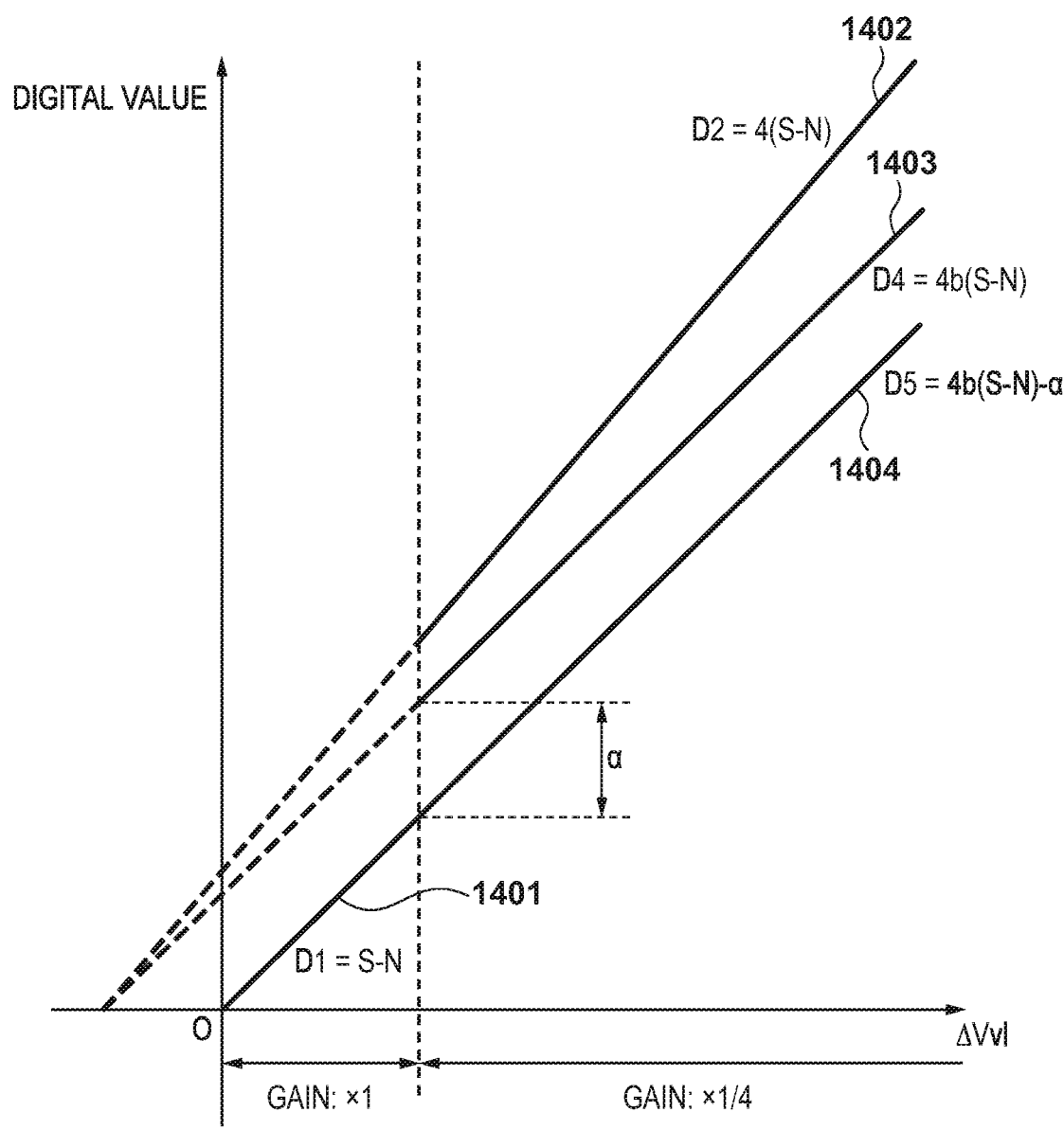

SOLID-STATE IMAGE SENSOR, METHOD OF CONTROLLING THE SAME, IMAGE SENSING SYSTEM, AND CAMERA

BACKGROUND OF THE INVENTION

Field of the Invention

The present invention relates to a solid-state image sensor, a method of controlling the same, an image sensing system, and a camera.

Description of the Related Art

There is known a solid-state image sensor that applies a plurality of gains to one pixel signal generated by a pixel in order to implement a wide dynamic range or a high-speed readout. Japanese Patent Laid-Open No. 2005-175517 and Japanese Patent Laid-Open No. 2014-131147 each disclose a method of amplifying a pixel signal, which is obtained by amplifying the pixel signal by a given gain, by another gain in accordance with the level of the obtained signal. The amplified pixel signal is converted into a digital signal by an A/D converter. This digital signal is divided by a value corresponding to the gain used to amplify the pixel signal, and a gain difference corrected pixel value is obtained.

SUMMARY OF THE INVENTION

As will be described later, a generated pixel value may not have a good linearity just by dividing an amplified digital signal by a value corresponding to a gain. An aspect of the present invention is to provide a technique of generating a pixel value that has good linearity in a solid-state image sensor which can switch the gain of an amplification circuit that amplifies a pixel signal.

According to some embodiments, a solid-state image sensor includes a pixel configured to generate a pixel signal corresponding to incident light, an amplification circuit configured to amplify the pixel signal, a setting circuit configured to set a gain of the amplification circuit based on a comparison result between a threshold and the pixel signal amplified by the amplification circuit, and a correction circuit configured to correct the pixel signal, which is amplified by a gain set by the setting circuit, by using a first correction value and a second correction value, the first correction value being a value corresponding to a gain error and the second correction value being a value corresponding to an offset of the amplification circuit in the gain.

Further features of the present invention will become apparent from the following description of exemplary embodiments (with reference to the attached drawings).

BRIEF DESCRIPTION OF THE DRAWINGS

FIG. 1 is a block diagram for explaining an example of the arrangement of a solid-state image sensor according to a first embodiment;

FIG. 14 is a graph for explaining a pixel value correction operation of the solid-state image sensor of FIG. 12;

DESCRIPTION OF THE EMBODIMENTS

Figure 2A:
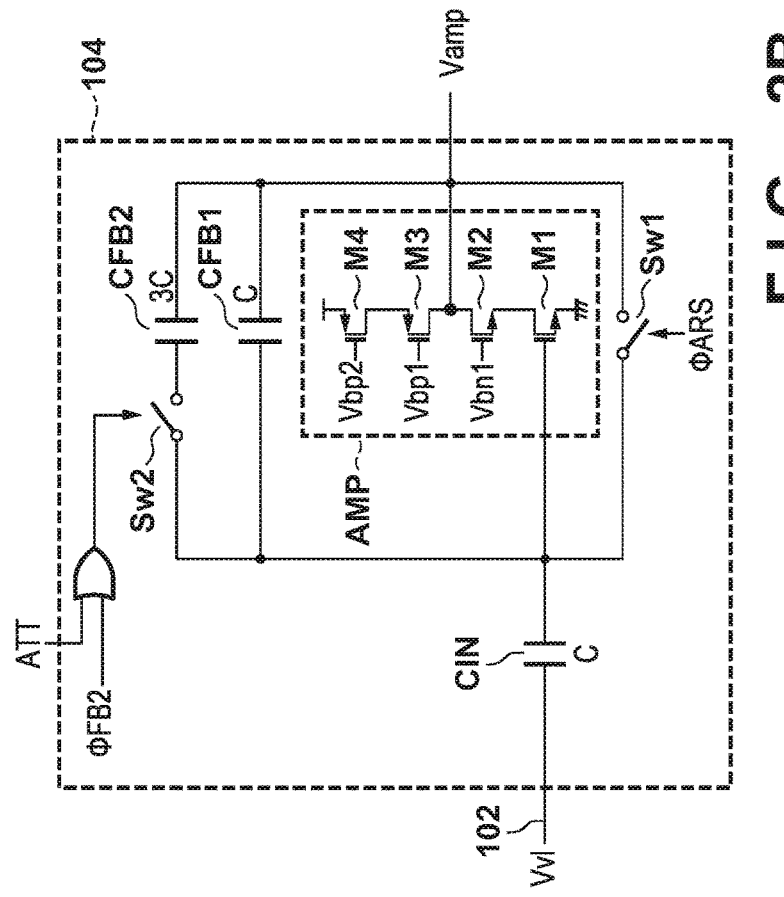
FIGS. 2A to 2C are diagrams for explaining examples of the respective circuit arrangements in the solid-state image sensor of FIG. 1.

Embodiments of the present invention will be described below with reference to the accompanying drawings. The same reference numerals will denote the same elements throughout the various embodiments, and a repetitive description thereof will be omitted. The embodiments can be changed and combined as needed.

First Embodiment

The arrangement of a solid-state image sensor IM1 according to the first embodiment will be described with reference to the circuit block diagram of FIG. 1. The solid-state image sensor IM1 includes the components shown in FIG. 1. A pixel array 101 is formed by a plurality of pixels 100 arranged in a matrix. A case in which the pixel array 101 includes 4 rows and 3 columns of pixels 100 will be described as an example in FIG. 1. However, the arrangement of the pixel array 101 is not limited to this. A pixel signal is generated in each pixel 100 in correspondence with incident light to the pixel 100. The plurality of pixels 100 forming the same row are commonly connected to a single driving line. A control signal for controlling the operation of each pixel 100 is supplied from a vertical scanning circuit 103 to the pixel 100 via the driving line. The plurality of pixels 100 forming the same column are also commonly connected to a single vertical line 102. A voltage signal supplied to each amplification circuit 104 via the corresponding vertical line 102 is called a vertical line signal Vvl. When a pixel signal is read out from each pixel 100 to the vertical line 102, the vertical line signal Vvl changes to a value corresponding to the pixel signal.

Each amplification circuit 104 generates an amplified signal Vamp by amplifying the vertical line signal Vvl and supplies the amplified signal Vamp to a corresponding setting circuit 105 and a corresponding comparison circuit 107. The amplification circuit 104 generates the amplified signal Vamp by amplifying the vertical line signal Vvl by one of the plurality of gains (to be described later). The amplification circuit 104 amplifies the pixel signal when the vertical line signal Vvl is a value according to the pixel signal.

Each setting circuit 105 compares the amplified signal Vamp with a predetermined threshold voltage Vsh and sets the gain of the corresponding amplification circuit 104 based on the comparison result. The setting circuit 105 supplies a setting signal ATT which indicates the gain setting of the amplification circuit 104 to the amplification circuit 104 and a corresponding memory unit 109. As an example, each setting circuit 105 of this embodiment sets the setting signal ATT to L level if the amplified signal Vamp is smaller than the threshold voltage Vsh and sets the setting signal ATT to H level of the amplified signal Vamp is larger than the threshold voltage Vsh. The amplification circuit 104 maintains or changes the gain used for amplifying the vertical line signal Vvl in accordance with the level of the setting signal ATT. That is, the setting circuit 105 determines whether the gain of the amplification circuit 104 should be changed. The gain is changed while the amplification circuit 104 is amplifying the pixel signal.

Other than the amplified signal Vamp from the amplification circuit 104, a reference signal Vr is supplied from the reference signal generation circuit 106 to each comparison circuit 107. The reference signal generation circuit 106 outputs a ramp signal as the reference signal Vr according to an instruction from a control circuit 113. The ramp signal is a signal that changes at a predetermined ratio with the elapsed time. The comparison circuit 107 compares the amplified signal Vamp and the reference signal Vr and supplies, to the corresponding memory unit 109, a comparison signal Vcmp corresponding to the comparison result. As an example, each comparison circuit 107 of this embodiment sets the comparison signal Vcmp to L level if the amplified signal Vamp is larger than the reference signal Vr and sets the comparison signal Vcmp to H level if the amplified signal Vamp is smaller than the reference signal Vr. For example, a comparator is used as the comparison circuit 107.

Other than the setting signal ATT from the corresponding setting circuit 105 and the comparison signal Vcmp from the corresponding comparison circuit 107, a count signal CNT is supplied from a counter 108 to each memory unit 109. In accordance with an instruction from the control circuit 113, the counter 108 starts counting together with start of ramp signal supply by the reference signal generation circuit 106 and counts up the count values expressed by the count signals CNT along with the lapse of time. Each memory unit 109 includes a memory 109S, a memory 109N, and a memory 109D. The memory 109D holds the level of the setting signal ATT supplied from the corresponding setting circuit 105. Each of the memories 109S and 109N holds a count value at the point when the level of the comparison signal Vcmp has switched. That is, the reference signal generation circuit 106, the comparison circuit 107, the counter 108, and the memory unit 109 form an A/D conversion circuit that converts the amplified signal Vamp into a digital value. The memory 109N holds a digital value corresponding to the amplified signal Vamp output by the amplification circuit 104 in a state in which the corresponding pixel 100 has been reset. The memory 109S holds a digital value corresponding to the amplified signal Vamp output by the amplification circuit 104 in a state in which a pixel signal has been read out from the corresponding pixel 100.

The amplification circuit 104, the setting circuit 105, the comparison circuit 107, and the memory unit 109 are arranged for each individual vertical line 102. A horizontal scanning circuit 110 sequentially reads out the digital values from the plurality of memory units 109 to a signal processing circuit 111. The signal processing circuit 111 generates a digital signal D corresponding to each pixel signal based on the digital value read out from each memory unit 109 and outputs the digital signal D to the outside of the solid-state image sensor IM1. The digital signal D expresses the pixel value of each pixel 100. The control circuit 113 controls the operations of the respective components by supplying control signals (to be described later) to the respective components of the solid-state image sensor IM1.

Examples of the circuit arrangements of the pixel 100, the amplification circuit 104, and the setting circuit 105 in FIG. 1 will be described next with reference to FIGS. 2A, 2B, and 2C, respectively. FIG. 2A describes an example of the circuit arrangement of the pixel 100. The pixel 100 includes a photodiode PD, an amplification transistor MSF, a transfer transistor MTX, a reset transistor MRS, and a selection transistor MSEL. The photodiode PD generates charges corresponding to incident light to the pixel 100 and accumulates these charges. The transfer transistor MTX, the reset transistor MRS, and the selection transistor MSEL are controlled to be in a conductive state or a nonconductive state according to respective control signals φPTX, φPRS, and φPSEL supplied from the vertical scanning circuit 103. The gate of the amplification transistor MSF is connected to a floating diffusion FD. The source of the amplification transistor MSF is connected to the vertical line 102 via the selection transistor MSEL. When the control signal φPRS changes to H level, the reset transistor MRS is changed to the conductive state, the floating diffusion FD is connected to a power supply voltage VDD, and the voltage of the floating diffusion FD is reset. Resetting of the voltage of the floating diffusion FD is called the resetting of the pixel 100. When the control signal φPTX changes to H level, the transfer transistor MTX is changed to the conductive state, and the charges accumulated in the photodiode PD are transferred to the floating diffusion FD. When the control signal φPSEL changes to H level, the selection transistor MSEL is changed to the conductive state, and a current is supplied to the amplification transistor MSF from a current source (not shown) via the vertical line 102. This causes a signal (that is, the pixel signal) based on the voltage from the floating diffusion FD to be read out to the vertical line 102.

Figure 2B:
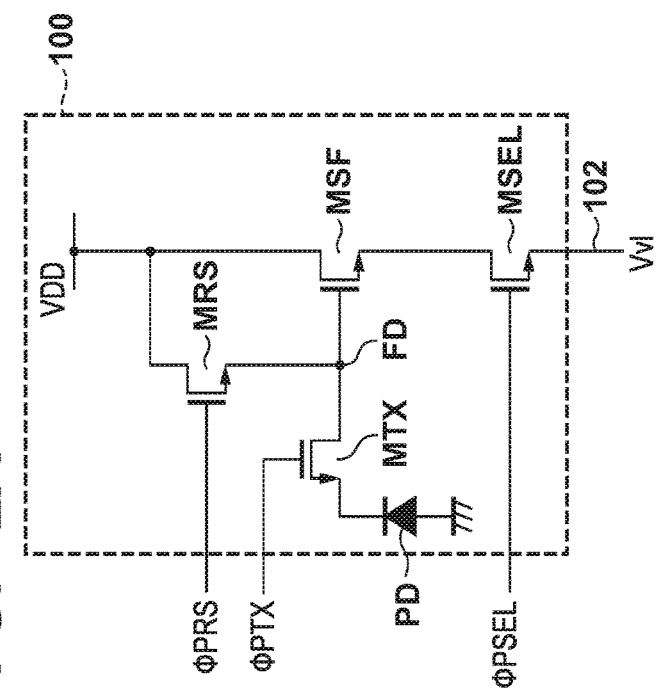

FIG. 2B describes an example of the circuit arrangement of the amplification circuit 104. The amplification circuit 104 includes an inverting amplifier AMP, capacitors CIN, CFB1, and CFB2, and switches S1 and S2. The vertical line signal Vvl is supplied to the input terminal of the inverting amplifier AMP via the capacitor CIN. Between the input terminal and the output terminal of the inverting amplifier AMP, the switch Sw1, the capacitor CFB1, and the series-connected switch Sw2 and capacitor CFB2 are connected in parallel. The capacitor CFB1 operates as a feedback capacitor. The ON/OFF of the switch Sw2 is controlled by the logical sum of the setting signal ATT and a control signal φFB2. When this logical sum is H level, the switch Sw2 is turned on, and the capacitor CFB2 operates as the feedback capacitor. The switch Sw1 is turned on when the control signal φARS is H level, and the charges accumulated in the capacitors CFB1 and CFB2 are reset. As an example, the capacitance values of the capacitors CIN, CFB1, and CFB2 of the embodiment are C, C, and 3C, respectively. Hence, if the switch Sw2 is OFF, the gain of the amplification circuit 104 is set to 1, and if the switch Sw2 is ON, the gain of the amplification circuit 104 is set to 4. The inverting amplifier AMP outputs, as the amplified signal Vamp, a signal obtained by amplifying the vertical line signal Vvl by the set gain. The capacitance values of the respective capacitors CIN, CFB1, and CFB2 are appropriately set according to the gain which is to be set in the amplification circuit 104.

As an example, the inverting amplifier AMP of the embodiment is implemented by an NMOS common source amplification circuit formed from transistors M1 and M2 which are NMOS transistors and transistors M3 and M4 which are PMOS transistors. The transistor M1 operates as a common source amplification transistor. The transistor M2 operates as a common gate amplification transistor. Additionally, the transistors M3 and M4 are cascode-connected and form a constant current load. DC bias voltages Vbn1, Vbp1, and Vbp2 are supplied to the gates of the transistors M2, M3, and M4, respectively. The operating points of the transistors are determined by these respective DC biases.

Figure 2C:
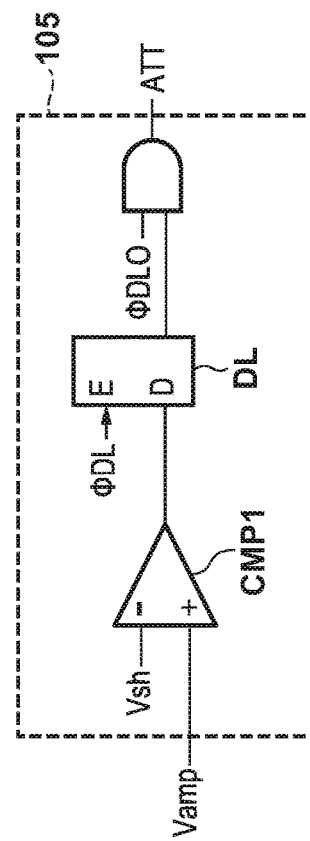

FIG. 2C describes an example of the circuit arrangement of the setting circuit 105. The setting circuit 105 includes a comparator CMP1, a D latch circuit DL, and an AND gate. The amplified signal Vamp is supplied to the non-inverting input terminal of the comparator CMP1. The threshold voltage Vsh is supplied to the inverting input terminal of the comparator CMP1. The comparator CMP1 determines the magnitude relationship of the amplified signal Vamp and the threshold voltage Vsh and supplies, to the D terminal of the D latch circuit DL, a signal corresponding to the determination result. The comparator CMP1 outputs an L-level signal if the amplified signal Vamp is smaller than the threshold voltage Vsh and outputs an H-level signal if the amplified signal Vamp is larger than the threshold voltage Vsh. The D latch circuit DL holds the level of the signal supplied to the D terminal according to a control signal φDL supplied to an E terminal and supplies the held level to an input terminal of the AND gate. A control signal φDLO is supplied to the other input terminal of the AND gate. When the control signal φDLO is H level, the AND gate outputs a signal of the level held by the D latch circuit DL as the setting signal ATT to the outside of the setting circuit 105. Also, when the control signal φDLO is L level, the AND gate outputs an L-level signal as the setting signal ATT to the outside of the setting circuit 105.

Figure 3:
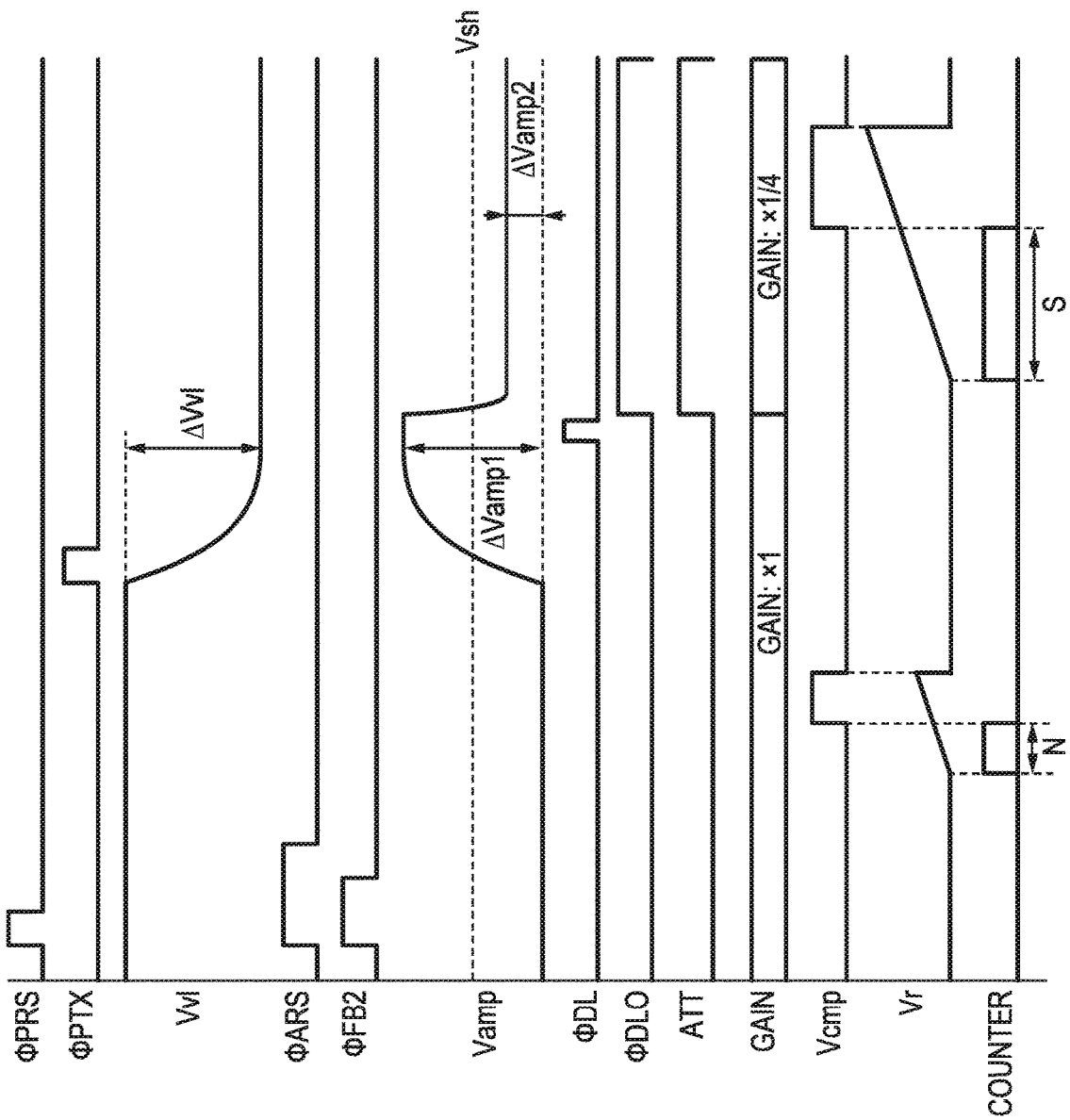
FIG. 3 is a timing chart for explaining an image signal reading operation of the solid-state image sensor of FIG. 1.

The operation of the solid-state image sensor IM1 will be described next with reference to FIGS. 3 to 5. The operation of the solid-state image sensor IM1 is performed by the control circuit 113 controlling the operations of the various components of the solid-state image sensor IM1. The operation of each pixel 100 is performed by the control circuit 113 controlling the vertical scanning circuit 103. The digital value readout from each memory unit 109 to the signal processing circuit 111 is performed by the control circuit 113 controlling the horizontal scanning circuit 110. The solid-state image sensor IM1 mainly performs a pixel signal reading operation, a correction value calculation operation, and a pixel value calculation operation. The pixel signal reading operation is an operation in which a pixel signal is read out from each pixel and a digital signal corresponding to the pixel signal is held in the corresponding memory unit 109. The correction value calculation operation is an operation in which a correction value is calculated to correct this digital value. The pixel value calculation operation is an operation in which this digital value is corrected to calculate a pixel value. The solid-state image sensor IM1 performs the operations in the order of the correction value calculation operation, the pixel signal readout operation, and the pixel value calculation operation. These operations are performed for each pixel 100. In the following sections, a description will be given in the order of the pixel signal readout operation, the pixel value calculation operation, and the correction value calculation operation.

The pixel signal readout operation will be described with reference to the timing chart of FIG. 3. FIG. 3 describes an operation for reading out a pixel signal once from a single pixel 100. The operation described in FIG. 3 is performed simultaneously for the plurality of pixels 100 that form the same row. The solid-state image sensor IM1 reads out a pixel signal from each pixel of the pixel array 101 by performing the operation described in FIG. 3 to each pixel on the plurality of pixel rows forming the pixel array 101. The vertical scanning circuit 103 maintains, throughout the period shown in FIG. 3, the control signal φPSEL supplied to the pixel signal readout operation target pixel 100 at H level and maintains the control signal φPSEL supplied to other pixels 100 at L level.

When the pixel signal readout operation is started, the vertical scanning circuit 103 resets the pixel 100 by temporarily changing the control signal φPRS to H level. Hence, a signal corresponding to the pixel 100 in a reset state is read out to the corresponding vertical line 102. This signal is called a pixel reset signal. When the pixel reset signal is read out to the vertical line 102, the vertical line signal Vvl becomes a value corresponding to this signal. The control circuit 113 resets, in parallel to the resetting of the pixel, the charges accumulated in the capacitors CFB1 and CFB2 by temporarily changing the control signals φARS and φFB2 to H level. After the vertical scanning circuit 103 changes the control signal φPRS to L level, the control circuit 113 changes the control signals φARS and φFB2 to L level.

During the above-described operation, the control circuit 113 sets the control signal φDLO to L level. As a result, the setting signal ATT output by the setting circuit 105 changes to L level. Since both the setting signal ATT and the control signal φFB2 are L level, the switch Sw2 of the amplification circuit 104 is turned off, and the capacitance value of the feedback capacitor connected to the inverting amplifier AMP changes to C. Since the capacitance value of the input capacitor connected to the inverting amplifier AMP is also C, the gain of the amplification circuit 104 is set to 1.

Next, the reference signal generation circuit 106 starts to supply a ramp signal as the reference signal Vr in accordance with the instruction from the control circuit 113. In other words, the reference signal generation circuit 106 starts to change the value of the reference signal Vr with the elapsed time. At the same time, the counter 108 starts to count up, from zero, the output count value in accordance with the instruction from the control circuit 113. When the reference signal Vr exceeds the amplified signal Vamp and the comparison signal Vcmp switches from L level to H level, the memory 109N holds the count value from the counter 108 at that point. This count value corresponds to a digital value obtained by A/D-converting the amplified signal Vamp obtained by amplifying the pixel reset signal by a gain of 1. This digital value will be called N hereinafter.

Subsequently, upon temporarily changing the control signal φPTX to the H level, the vertical scanning circuit 103 transfers the charges accumulated in the photodiode PD to the floating diffusion FD. As a result, the pixel signal from the pixel 100 is read out to the vertical line 102, and the vertical line signal Vvl changes to a value corresponding to the pixel signal. ΔVvl represents the change amount (that is, the difference between the pixel signal and the pixel reset signal) of the vertical line signal Vvl at this time point using the reset time of the pixel 100 as a reference. ΔVvl has a value corresponding to the incident light amount to the pixel 100. The amplified signal Vamp changes along with the change of the vertical line signal Vvl. ΔVamp1 expresses the change amount of the amplified signal Vamp in a state in which the gain of the amplification circuit 104 is set to 1. Here, the threshold voltage Vsh is set to be equal to or less than ¼ of the output dynamic range of the amplification circuit 104. Hence, the solid-state image sensor IM1 performs different operations in a case in which the amplified signal Vamp is equal to or more than threshold voltage Vsh and in a case in which the amplified signal Vamp is less than the threshold voltage Vsh. A case in which the amplified signal Vamp obtained by amplifying the pixel signal by a gain of 1 is larger than the threshold voltage Vsh will be described below.

After a predetermined time has passed since the vertical scanning circuit 103 changed the control signal φPTX to L level, the control circuit 113 temporarily changes the control signal φDL to H level. Since the amplified signal Vamp is larger than the threshold voltage Vsh, an H-level signal is held in the D latch circuit DL. Next, the control circuit 113 changes the control signal φDLO to H level. The setting circuit 105 outputs the signal held in the D latch circuit DL, and the setting signal ATT becomes H level. As a result, the switch Sw2 of the amplification circuit 104 is turned on, the capacitor CFB2 is connected to the inverting amplifier AMP, and the capacitance value of the feedback capacitor connected to the inverting amplifier AMP changes to 4 C. Since the capacitance value of the input capacitor connected to the inverting amplifier AMP is C, the gain of the amplification circuit 104 is set to ¼. The value of the amplified signal Vamp is also changed along with this setting. ΔVamp2 represents the change amount of the amplified signal Vamp in a state in which the gain of the amplification circuit 104 is set to ¼.

Subsequently, the solid-state image sensor IM1 A/D-converts the amplified signal Vamp obtained by amplifying the pixel signal in the same manner as A/D-converting the amplified signal Vamp obtained by amplifying the pixel reset signal. The memory 109S holds the digital signal obtained by A/D-converting the amplified signal Vamp obtained by amplifying the pixel signal. This digital value will be called S hereinafter. Then, the memory 109D holds the level of the setting signal ATT. Finally, the control circuit 113 changes the control signal φDLO to L level to change the setting signal ATT to L level in order to move on to the next row readout.

From the above operation, the level of the setting signal ATT when the pixel signal is A/D-converted is held in the memory 109D, the digital value N representing the amplified pixel reset signal is held in the memory 109N, and the digital value S representing the amplified pixel signal is held in the memory 109S. When the gain of the amplification circuit 104 is changed from 1 to ¼ as in the aforementioned example, the H-level setting signal ATT is held in the memory 109D, and the digital signal representing the pixel signal amplified by the gain of ¼ is held in the memory 109S. On the other hand, when the amplified signal Vamp obtained by amplifying the pixel signal by a gain of 1 is smaller than the threshold voltage Vsh, the gain of the amplification circuit 104 is maintained at 1. In this case, the L-level setting signal ATT is held in the memory 109D, and the digital signal S representing the pixel signal amplified by the gain of 1 is held in the memory 109S. When the gain of the amplification circuit 104 is changed from 1 to ¼ and when the gain is maintained at 1, the digital signal N representing the pixel reset signal amplified by the gain of 1 is held in the memory 109N.

The pixel value calculation operation will be described next. The signal processing circuit 111 calculates a pixel value based on the digital signal held in the memory unit 109. A case in which the L-level setting signal ATT is held in the memory 109D will be described first. In this case, the digital signal S representing the pixel signal amplified by the gain of 1 is held in the memory 109S, and the digital signal N representing the pixel reset signal amplified by the gain of 1 is held in the memory 109N. Hence, the signal processing circuit 111 calculates the pixel value by performing digital CDS (Correlated Double Sampling) processing. In particular, the signal processing circuit 111 calculates S−N and sets this value as the pixel value.

A case in which the H-level setting signal ATT is held in the memory 109D will be described next. In this case, the digital signal S representing the pixel signal amplified by the gain of ¼ is held in the memory 109S, and the digital signal N representing the pixel reset signal amplified by the gain of 1 is held in the memory 109N. Hence, the signal processing circuit 111 cannot calculate a correct pixel value only by simply performing digital CDS processing by using the digital values S and N. This reason will be explained with reference to FIG. 4.

Figure 4:
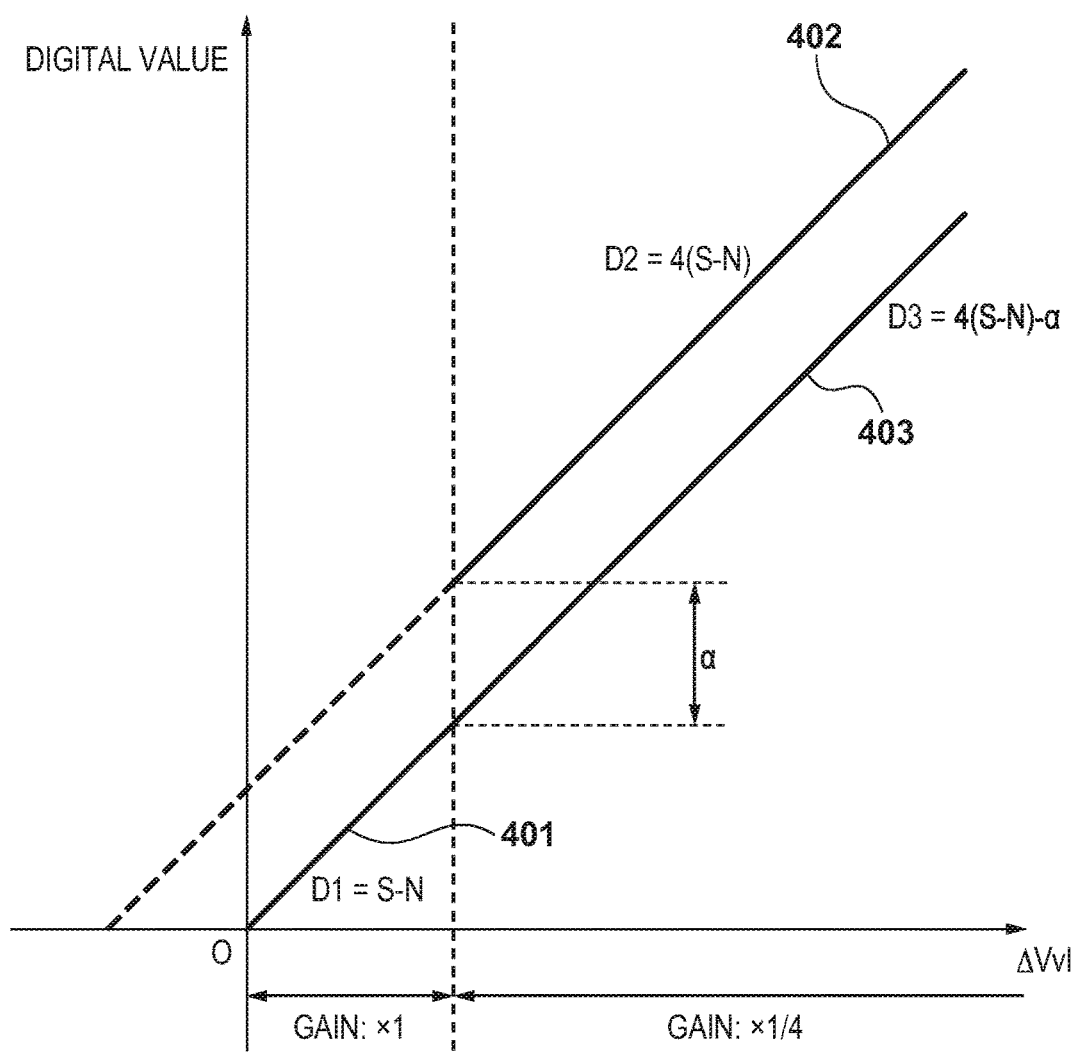
FIG. 4 is a graph for explaining a pixel value correction operation of the solid-state image sensor of FIG. 1.
Figure 5:
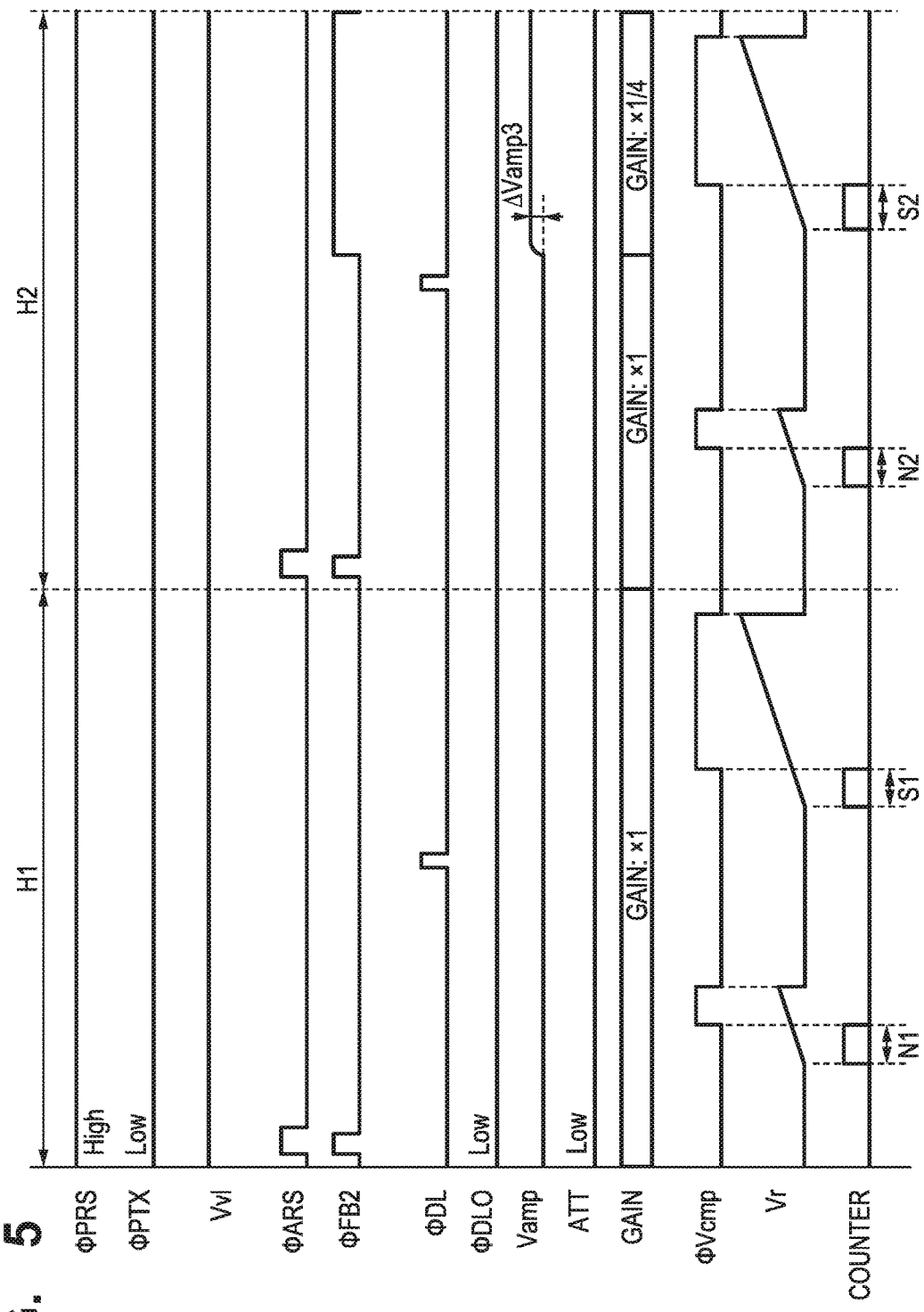
FIG. 5 is a timing chart for explaining a correction value calculation operation of the solid-state image sensor of FIG. 1.

The abscissa of the graph in FIG. 4 indicates the change amount ΔVvl of the vertical line signal Vvl. The ordinate of the graph in FIG. 4 represents the digital value. The change amount ΔVvl corresponds to the incident light amount to the pixel 100. The change amount ΔVvl becomes zero when the vertical line signal Vvl is a value corresponding to the pixel reset signal.

A line 401 represents the relationship between the change amount ΔVvl included in the range where the gain of the amplification circuit 104 is set to 1 and a digital signal D1 calculated by $$D1 = S - N \quad (1)$$

Since the digital values S and N both are values generated in a state in which the gain of the amplification circuit 104 is set to 1, the digital signal D1 which properly represents the incident light amount is obtained by performing digital CDS processing. For example, if the change amount ΔVvl (incident light amount) is zero, the digital signal D1 also changes to zero. When the gain of the amplification circuit 104 is set to 1 (that is, when the L-level signal is held in the memory 109D), the signal processing circuit 111 outputs the digital signal D1 as the aforementioned digital signal D.

A line 402 represents the relationship between the change amount ΔVvl included in the range where the gain of the amplification circuit 104 is set to ¼ and a digital signal D2 calculated by $$D2 = 4(S - N) \quad (2)$$

The gradient of the line 402 matches that of the line 401 since the S−N obtained by the digital CDS processing has been multiplied a reciprocal (4) of the gain. However, due to a feedthrough of the switch Sw2 or the like generated when the capacitor CFB2 is connected, the pixel reset signal amplified by a gain of 1 and the pixel signal amplified by a gain of ¼ have different offsets from each other. Hence, as shown in FIG. 4, a shift α between the digital signal D2 and the digital signal D1 is generated in the ΔVvl value by which gain setting is switched.

Therefore, when the gain of the amplification circuit 104 is set to ¼, the signal processing circuit 111 calculates a digital signal D3 by $$D3 = 4(S-N) - \alpha \quad (3)$$

A line 403 represents the relationship between the change amount ΔVvl included in the range where the gain of the amplification circuit 104 is set to ¼ and the digital signal D3 calculated according to the above equation (3). As shown in FIG. 4, the line 403 has a good linearity with respect to the line 401. When the gain of the amplification circuit 104 is set to ¼ (that is, when the H-level signal is held in the memory 109D), the signal processing circuit 111 outputs the digital signal D3 as the digital signal D.

Here, when generalizing the gain of the amplification circuit 104 as G, the signal processing circuit 111 calculates the digital signal D by $$D = \beta_G \times (S-N) - \alpha_G \quad (4)$$

where $\alpha_G$ is an offset correction value corresponding to the offset of the amplification circuit 104, and $\beta_G$ is a gain correction value corresponding to the gain of the amplification circuit 104. $\alpha_G$ and $\beta_G$ are set for each gain and held in a memory 112. In the aforementioned example, $\alpha_1 = 0$, $\alpha_{1/4} = \alpha$, $\beta_1 = 1$, and $\beta_{1/4} = 4$. In this embodiment, $\alpha_1 = 0$ because the digital value N representing the pixel reset signal amplified by a gain of 1 is used to perform the digital CDS processing. α is calculated by the correction value calculation operation (to be described later). $\beta_G$ is the reciprocal of the gain. $\beta_G$ is logically calculated based on the capacitance value connected to the inverting amplifier AMP and stored in the memory 112 at the time of manufacturing the solid-state image sensor IM1. The signal processing circuit 111 generates the digital signal D representing a pixel value calculated in the aforementioned manner and outputs this digital signal D to the outside of the solid-state image sensor IM1. As described above, the signal processing circuit 111 can be called a correction circuit since it corrects the digital value S representing the pixel signal.

The correction value calculation operation will be described with reference to the timing chart of FIG. 5. FIG. 5 describes the operation of calculating a correction value for one amplification circuit 104. This correction value is used for the plurality of pixels 100 commonly connected to the corresponding amplification circuit 104. The pixel array 101 includes one or more rows formed from pixels 100 that do not contribute to image generation and that are for calculating the correction value. Throughout the periods shown in FIG. 5, the vertical scanning circuit 103 maintains the control signal φPSEL supplied to a correction value calculation pixel 100 at H level and maintains the control signals φPSEL supplied to the other pixels 100 at L level. Additionally, throughout the periods shown in FIG. 5, the vertical scanning circuit 103 maintains the control signal φPRS supplied to the correction value calculation pixel 100 at H level and maintains the control signal φPTX at L level. Hence, throughout the periods shown in FIG. 5, the pixel reset signal is supplied as the vertical line signal Vvl.

The correction value calculation operation is formed by an operation performed in a period H1 and an operation performed in a subsequent period H2. In the period H1, the control circuit 113 holds, in the same manner as in the pixel signal readout operation, a digital value S1 in the memory 109S after holding a digital value N1 in the memory 109N.

In the period H1, the L-level setting signal ATT is output by the control circuit 113 setting the control signal φDLO to L level. Hence, the digital values N1 and S1 both represent the amplified signal Vamp obtained by a gain of 1. The signal processing circuit 111 reads out the digital values N1 and S1 and holds the readout values in the memory 112.

Next, in the period H2, the control circuit 113 holds, by performing the same processing as in the period H1, a digital value S2 in the memory 109S after holding a digital value N2 in the memory 109N. However, the control circuit 113 sets, before generating the digital value S2, the gain of amplification circuit 104 to ¼ by switching the control signal φFB2 to H level. Hence, the digital value N2 represents the amplified signal Vamp obtained by a gain of 1, and the digital value S2 represents the amplified signal Vamp obtained by a gain of ¼. The signal processing circuit 111 reads out the digital values N2 and S2 and holds the readout values in the memory 112.

Next, the signal processing circuit 111 calculates an offset correction value $\alpha_{1/4}$ by $$\alpha_{1/4} = (S2-N2) - (S1-N1) \quad (5)$$

Here, the digital values N1 and N2 each represent a value of the amplified signal Vamp obtained by amplifying the pixel reset signal by a gain of 1. The digital signal S1 represents the value of the amplified signal Vamp obtained by amplifying, by a gain of 1, the pixel signal when ΔVvl=0. The digital signal S2 represents the value of the amplified signal Vamp obtained by amplifying, by a gain of ¼, the pixel signal when ΔVvl=0. Hence, the $\alpha_{1/4}$ obtained by the equation (5) matches the α shown in FIG. 4.

As described above, according to this embodiment, an offset error due to a feedthrough or the like caused from changing the gain of the amplification circuit 104 can be removed, and a solid-state image sensor that has a good linearity can be implemented. In the correction value calculation operation of this embodiment, the digital values S1 and S2 were calculated based on the pixel reset signal. However, in place of these values, a test signal of a predetermined value can be supplied to the amplification circuit 104 from another voltage source that is different from the pixel 100. The components of the solid-state image sensor IM1 may be implemented on the same semiconductor substrate. Alternatively, the signal processing circuit 111 may be implemented on another semiconductor substrate from a semiconductor substrate on which the remaining components of the solid-state image sensor IM1.

First Modification of First Embodiment

Figure 6:
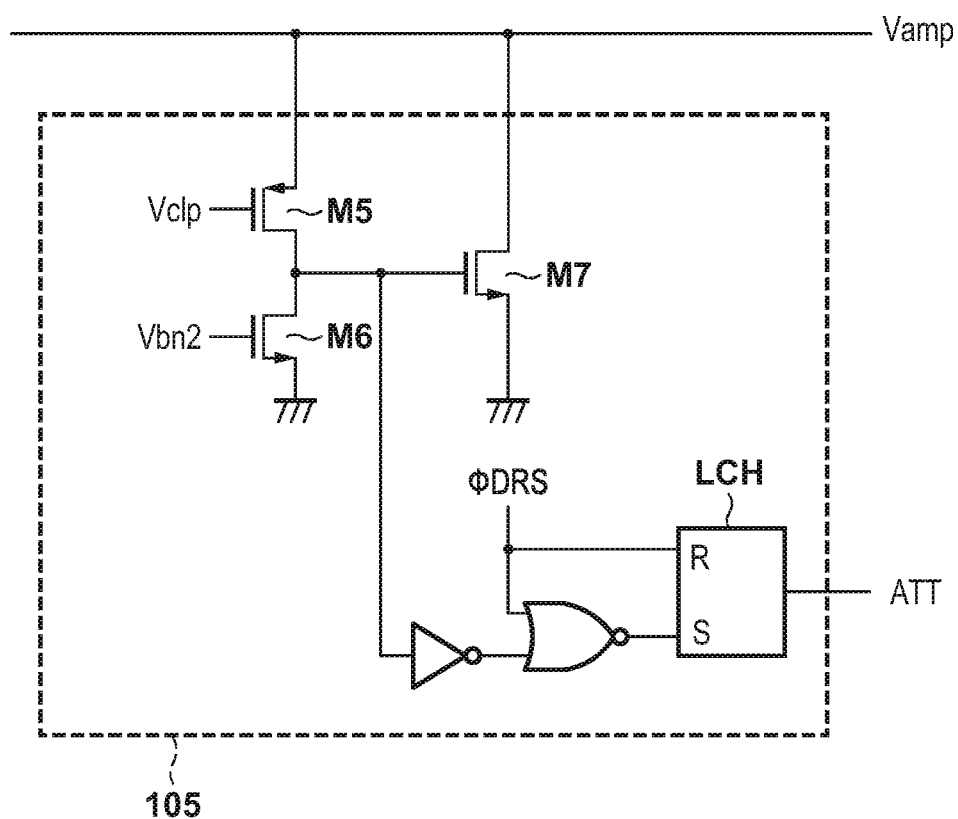
FIG. 6 is a diagram for explaining an example of the circuit arrangement of a first modification of the solid-state image sensor of FIG. 1.
Figure 7:
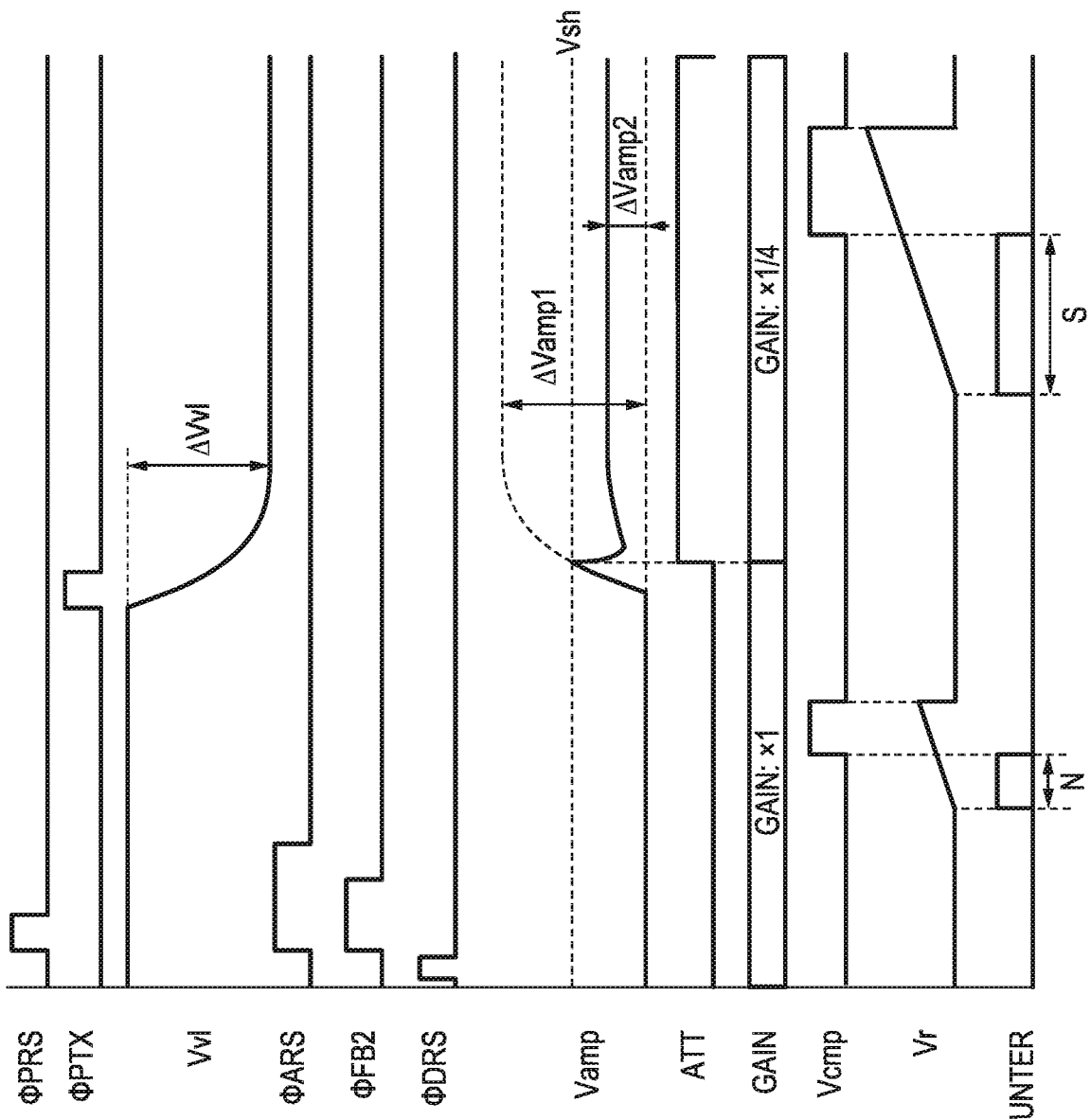
FIG. 7 is a timing chart for explaining a pixel signal reading operation of the first modification of the solid-state image sensor of FIG. 1.

The first modification of the solid-state image sensor IM1 will be described with reference to FIGS. 6 and 7. In the first modification, the arrangement of the setting circuit 105 is different. The setting circuit 105 of the first modification has a function that clips the amplified signal Vamp to be equal to or less than the threshold voltage Vsh. FIG. 6 describes an example of the circuit arrangement of the setting circuit 105 according to the first modification.

The setting circuit 105 includes a transistor M5 which is a PMOS transistor and transistors M6 and M7 which are NMOS transistors. The source of the transistor M5 is connected to the output terminal of the amplification circuit 104, and the transistor M5 clips the amplified signal Vamp. The threshold voltage Vsh of the clipping operation is determined by a voltage Vclp input to the gate of the transistor M5. A DC bias voltage Vbn2 is input to the gate of the transistor M6, and a constant current is supplied to the drain of the transistor M5 when the transistor M5 performs the clipping operation. The drain of the transistor M5 is also connected to an inverter and the gate of the transistor M7. The source of the transistor M7 is grounded to a GND potential, and the drain of the transistor M7 is connected to the output terminal of the amplification circuit 104. After NOR processing with a control signal ϕDRS is performed, the output from the inverter is input to the S terminal of an RS latch circuit LCH. The control signal ϕDRS is input to an R terminal which is the other input terminal of the RS latch circuit LCH. Hence, when the control signal ϕDRS changes to H level, the RS latch circuit LCH is reset since the R terminal is set to H level and the S terminal is set to L level. The output from the RS latch circuit LCH becomes the output from the setting circuit 105 and outputs the setting signal ATT.

If the amplified signal Vamp is lower than the threshold voltage Vsh, the transistor M5 is in the nonconductive state. Since the DC bias voltage is input to the gate of the transistor M6, the gate voltage of the transistor M7 is set to almost GND level. Accordingly, the transistor M7 is set to the nonconductive state. In this case, the transistors M5 and M7 are both in nonconductive states and do not influence the operation of the inverting amplifier AMP. On the other hand, if the amplified signal Vamp exceeds the threshold voltage Vsh, the transistor M5 changes to the conductive state. In this case, the gate voltage of the transistor M7 rises, and the transistor M7 changes to the conductive state. As a result, a load current from the inverting amplifier AMP supplied from the transistors M3 and M4 is also supplied to the setting circuit 105, and it becomes a clipped state in which the amplified signal Vamp does not rise beyond almost the threshold voltage Vsh.

The pixel signal readout operation according to the first modification will be described with reference to the timing chart of FIG. 7. The correction value calculation operation and the pixel value calculation operation according to the first modification may be the same as those of the aforementioned first embodiment. The pixel signal readout operation according to the first modification differs from the pixel signal readout operation according to the first embodiment in the point that the control circuit 113 supplies, in place of the control signals ϕDL and ϕDLO, the control signal ϕDRS to the setting circuit 105. The remaining points may be the same as the first embodiment.

When the pixel signal readout operation is started, the control circuit 113 temporarily changes the control signal ϕDRS to H level to reset the RS latch circuit LCH. As a result, the setting circuit 105 outputs the L-level setting signal ATT. Subsequently, after the same processes as those in the first embodiment are performed, the pixel signal is read out from the pixel 100 to the corresponding vertical line 102, and the vertical line signal Vvl changes to a value corresponding to the pixel signal.

If the amplified signal Vamp is lower than the threshold voltage Vsh, the gate voltage of the transistor M7 is at almost GND level. Therefore, since the L-level signal continues to be input to the S terminal of the RS latch circuit LCH, the setting signal ATT maintains L level. On the other hand, if the amplified signal Vamp reaches the threshold voltage Vsh, the gate voltage of the transistor M7 also reaches the threshold of the inverter. As a result, the input to the S terminal of the RS latch circuit LCH is inverted to H level. Along with this, the RS latch circuit LCH outputs the H-level setting signal ATT and maintains this state. When the setting signal ATT changes to H level, the gain of the amplification circuit 104 is changed to ¼, the amplified signal Vamp becomes equal to or less than the threshold voltage Vsh, and clipping is canceled. At this time, since the setting signal ATT is held at H level, the vertical line signal Vvl is amplified by a gain of ¼. After the amplified signal Vamp has sufficiently been settled, the same processes as those in the first embodiment are performed, and the digital value S is generated.

The same effects as those of the first embodiment can be obtained in the first modification. In addition, in the first modification, due to the clipping function of the setting circuit 105, the amplified signal Vamp will not become larger than the threshold voltage Vsh. Hence, the threshold voltage Vsh can be set to an output saturation level of the amplification circuit 104 and the dynamic range of the amplification circuit 104 can be effectively used. Note that if the amplified signal Vamp changes to a value close to the clipping voltage, the amplified signal Vamp will be greatly influenced by the transistor M5 and cannot output a signal with high accuracy. Therefore, other than the period from when the vertical line signal Vvl corresponding to the pixel signal is input to the amplification circuit 104 to when the setting circuit 105 makes a determination, the clipping function of the setting circuit 105 may be disabled. For example, if the control circuit 113 raises the voltage Vclp before the pixel signal is read out to the vertical line 102 and after the determination by the setting circuit 105, a digital value with higher accuracy can be obtained.

Second Modification of First Embodiment

Figure 8:
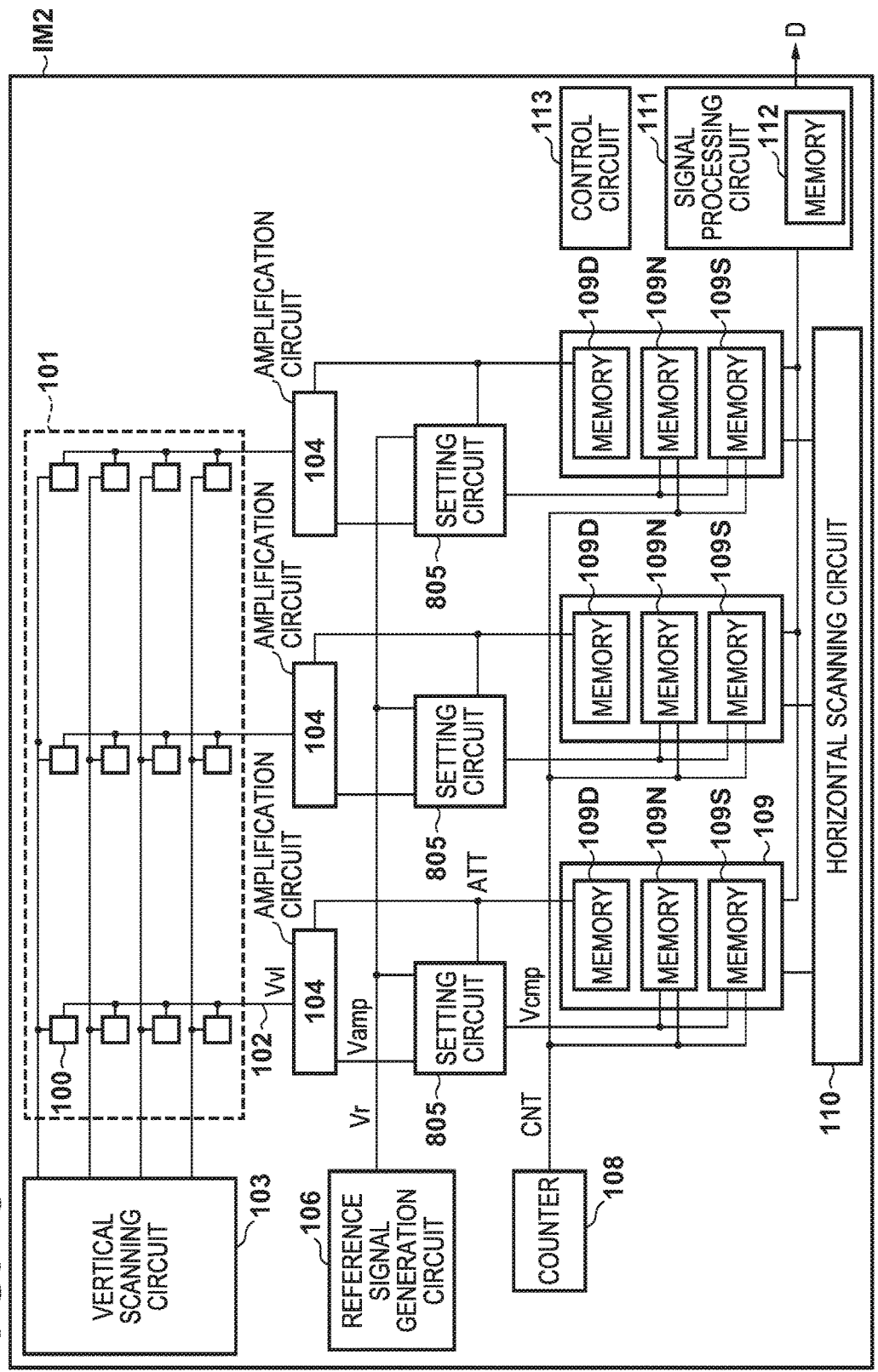
FIG. 8 is a block diagram for explaining an example of the arrangement of a second modification of the solid-state image sensor of FIG. 1.
Figure 9:
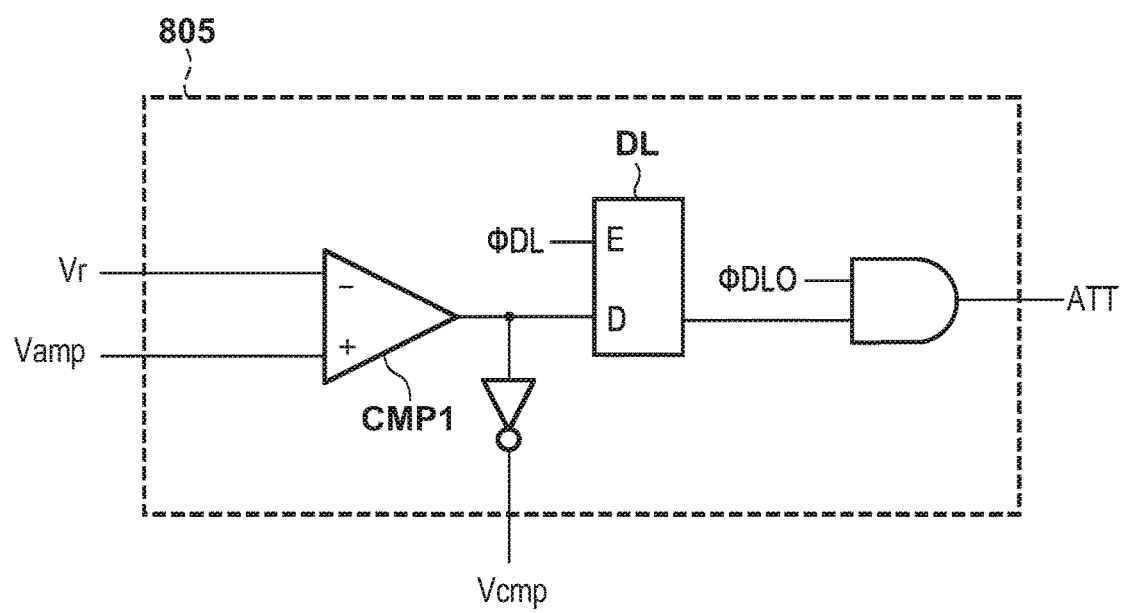
FIG. 9 is a diagram for explaining an example of the circuit arrangement of a second modification of the solid-state image sensor of FIG. 1.
Figure 10:
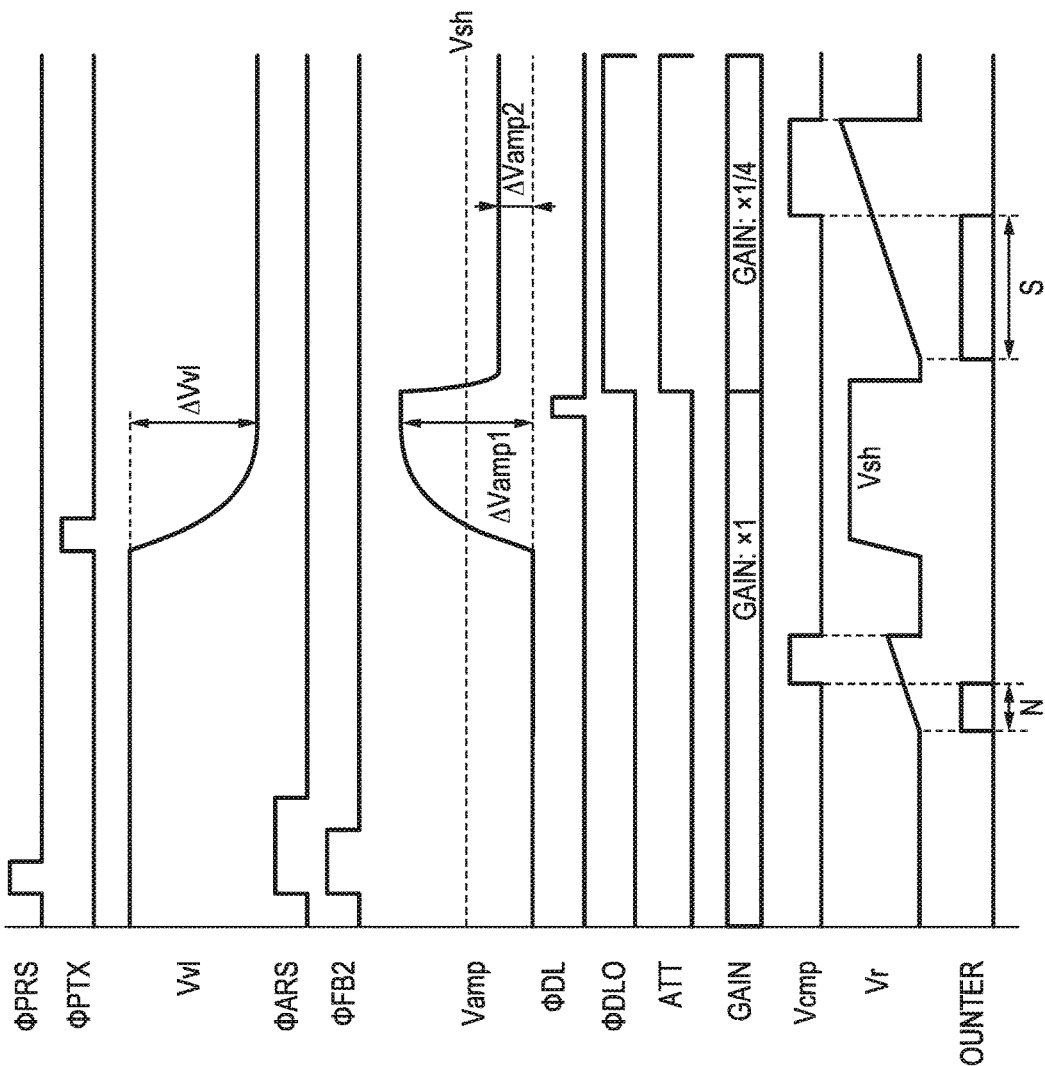
FIG. 10 is a timing chart for explaining a pixel signal reading operation of the second modification of the solid-state image sensor of FIG. 1.

A solid-state image sensor IM2 which is the second modification of the solid-state image sensor IM1 will be described with reference to FIGS. 8 to 10. As shown in FIG. 8, the solid-state image sensor IM2 according to the second modification differs from the solid-state image sensor IM1 in that, in place of the setting circuit 105 and the comparison circuit 107, a setting circuit 805 is included. The remaining points may be the same as the solid-state image sensor IM1. An example of the circuit arrangement of the setting circuit 805 will be described with reference to FIG. 9. As shown in FIG. 9, the setting circuit 805 includes an arrangement in which the setting circuit 105 and the comparison circuit 107 shown in FIG. 1 have been commonized.

The pixel signal readout operation according to the second modification will be described next with reference to the timing chart of FIG. 10. The correction value calculation operation and the pixel value calculation operation according to the second modification may be the same as those in the aforementioned first embodiment. The pixel signal readout operation according to the second modification differs from the pixel signal readout operation according to the first embodiment in that the reference signal Vr supplied by the reference signal generation circuit 106 is different. The remaining points may be the same as in the first embodiment. After holding the digital value N in the memory 109N, the control circuit 113 changes the value of the reference signal Vr, supplied by the reference signal generation circuit 106, to the threshold voltage Vsh. As a result, the amplified signal Vamp and the threshold voltage Vsh are compared by the setting circuit 805, and the comparison result is output as the setting signal ATT.

Third Modification of First Embodiment

Figure 11:
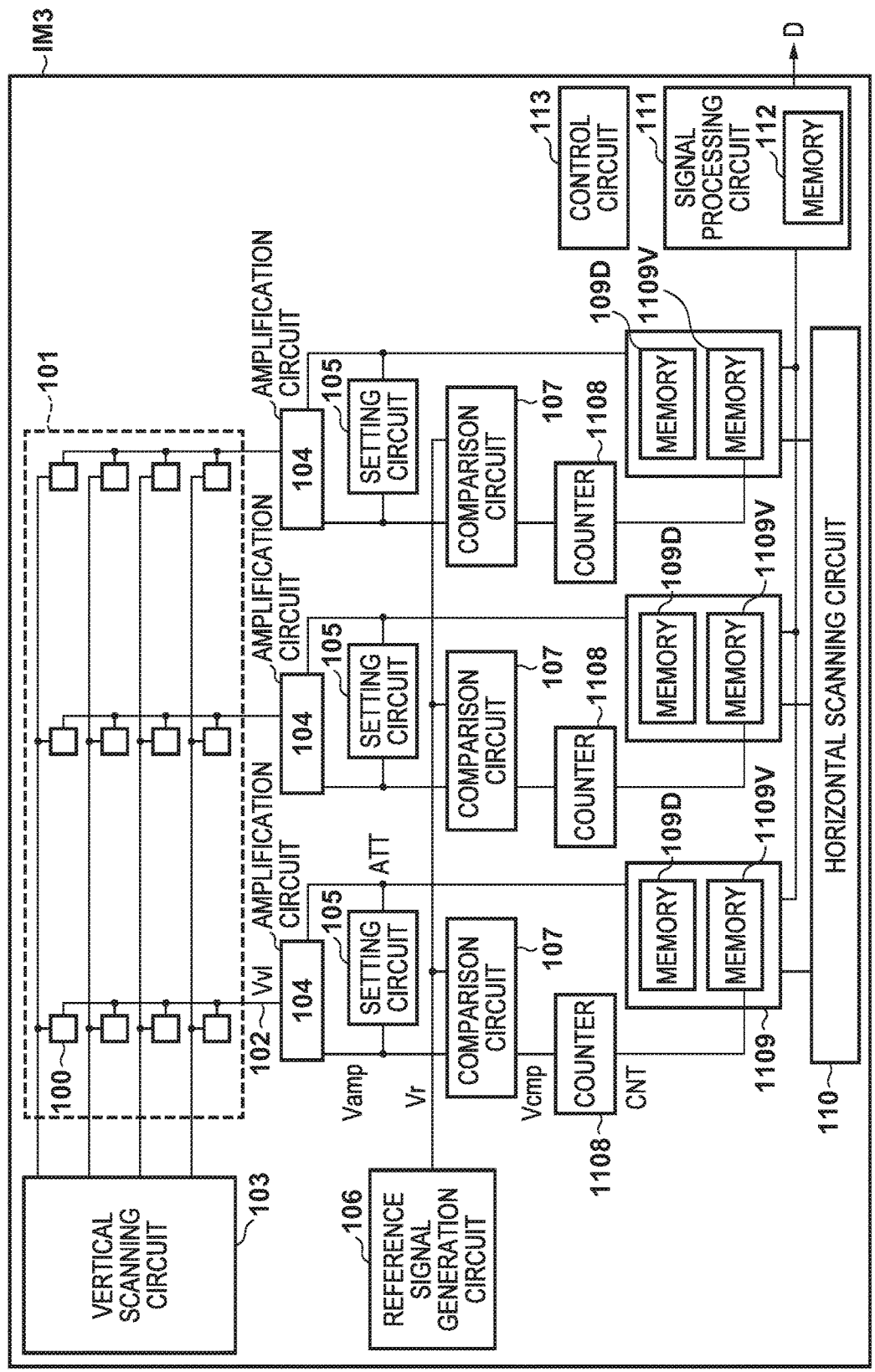
FIG. 11 is a block diagram for explaining an example of the circuit arrangement of a third modification of the solid-state image sensor of FIG. 1.
Figure 12:
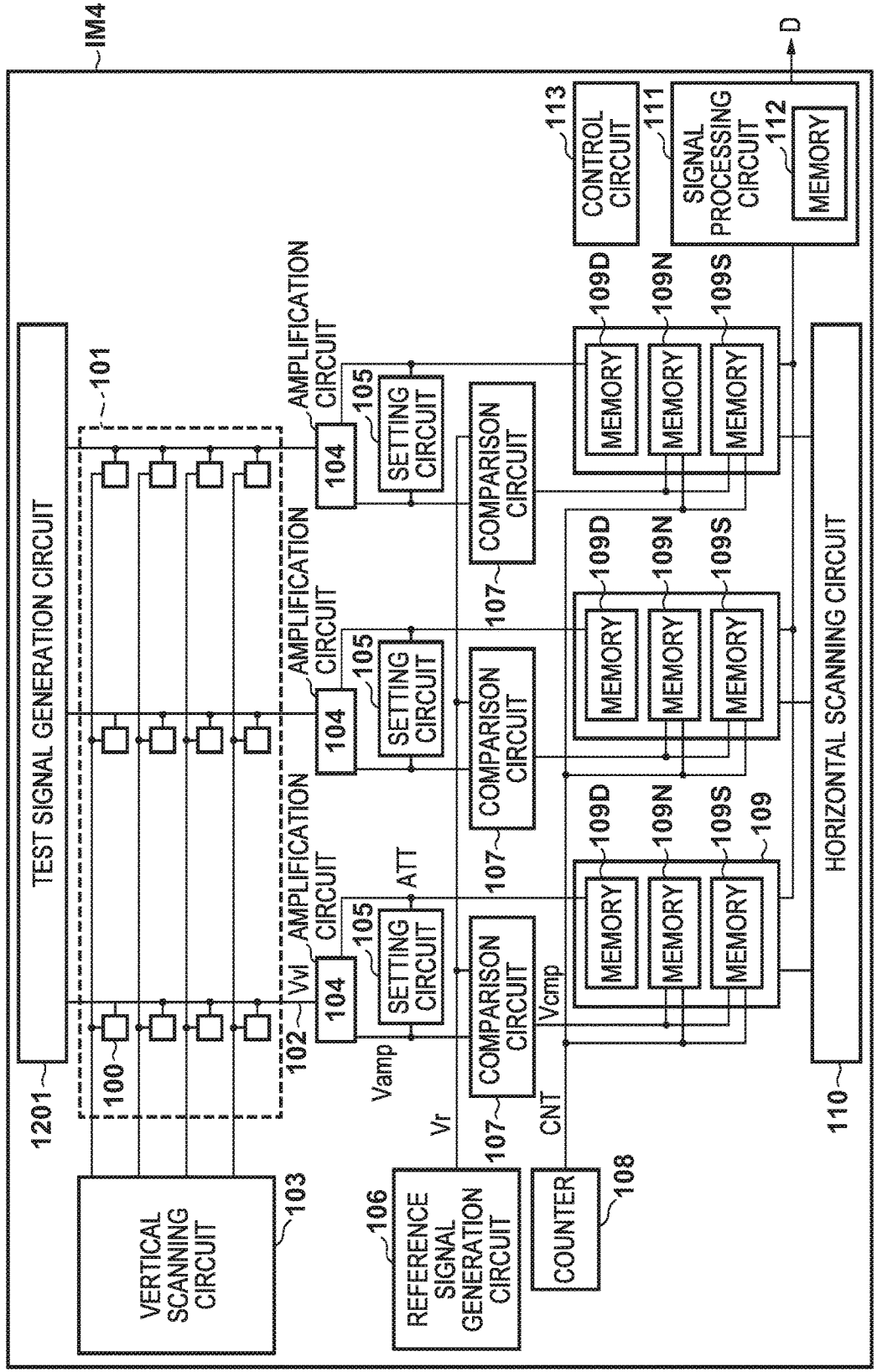
FIG. 12 is a block diagram for explaining an example of the arrangement of a solid-state image sensor according to a second embodiment.

A solid-state image sensor IM3 which is the third modification of the solid-state image sensor IM1 will be described with reference to FIG. 11. As shown in FIG. 11, the solid-state image sensor IM3 according to the third modification differs from the solid-state image sensor IM1 in that counters 1108 and memory units 1109 are included in place of the counter 108 and the memory units 109. The remaining points may be the same as those of the solid-state image sensor IM1.

Each counter 1108 has an up/down counting function. The counter 1108 is arranged for each pixel column. When A/D-converting the amplified signal Vamp obtained by amplifying the pixel reset signal, the counter 1108 starts down-counting from zero in accordance with the instruction from the control circuit 113. As a result, a value obtained by changing the sign of the digital value N of the first embodiment is held in the counter 1108. Next, when A/D-converting the amplified signal Vamp obtained by amplifying the pixel signal, the counter 1108 starts up-counting using the held value (that is, −N) as the initial value in accordance with the instruction from the control circuit 113. The counter 1108 outputs a value corresponding to S−N in the first embodiment at the point when this A/D conversion ends. A memory 1109V of each memory unit 1109 holds this value. The signal processing circuit 111 performs the aforementioned pixel value calculation operation by using the value (S−N) held in each memory 1109V. Also, in the correction value calculation operation, since values corresponding to S1−N1 and S2−N2 are held in the memory 1109V, the signal processing circuit 111 calculates the correction value using these values.

Second Embodiment

A solid-state image sensor IM4 according to the second embodiment will be described with reference to FIGS. 12 to 15. The solid-state image sensor IM4 differs from the solid-state image sensor IM1 in that a test signal generation circuit 1201 is further included. The test signal generation circuit 1201 supplies a test signal to each of the plurality of vertical lines 102. In the first embodiment, a value (4) logically calculated based on the capacitance value of the feedback capacitor is used as the gain correction value $\beta_{1/4}$. However, since it is difficult to accurately control a gain, even if the gain of an amplification circuit 104 is set to ¼, the actual amplified signal Vamp may be amplified by a gain of a different value.

The abscissa of the graph in FIG. 14 indicates a change amount ΔVvl of a vertical line signal Vvl. The ordinate of the graph in FIG. 14 represents the digital value. The change amount ΔVvl corresponds to the incident light amount to the pixel 100. The change amount ΔVvl becomes zero when the vertical line signal Vvl is a value corresponding to a pixel reset signal.

A line 1401 represents, in the same manner as the line 401, the relationship between the change amount ΔVvl included in the range where the gain of the amplification circuit 104 is set to 1 and a digital signal D1 calculated according to the above-described equation (1).

A line 1402 represents the relationship between the change amount ΔVvl included in the range where the gain of the amplification circuit 104 is set to ¼ and a digital signal D2 calculated according to the above-described equation (2). Since S−N obtained by digital CDS processing is multiplied by a reciprocal (4) of the gain, the gradient of the line 1402 logically matches the gradient of the line 1401. However, the gradients of these lines may not match due to a gain error. In this case, even if offset correction is performed as in the embodiment of FIG. 1, a digital signal D will not have good linearity. Hence, a signal processing circuit 111 of the second embodiment determines the gain correction value $\beta_{1/4}$ of the aforementioned equation (4) not from a logical value, but based on an amplified signal Vamp that has been actually obtained.

In one example, the signal processing circuit 111 calculates a correction coefficient b for correcting the gain correction value and sets a value obtained by multiplying the reciprocal (4) of the logical gain value by this correction coefficient b as the gain correction value $\beta_{1/4}$. In particular, the signal processing circuit 111 calculates the correction efficient b so that the gradient of a line 1403 expressing a digital signal D4 calculated by an equation (6) below will match the gradient of line 1401.

$$D4=4b(S-N) \qquad (6)$$

The calculation method of the correction coefficient b will be described later.

Subsequently, the signal processing circuit 111 calculates the digital value by subtracting an offset correction value α from D4. That is, the signal processing circuit 111 calculates a digital signal D5 by $$D5=4b(S-N)-\alpha \qquad (7)$$

A line 1404 represents the relationship between the change amount ΔVvl included in the range where the gain of the amplification circuit 104 is set to ¼ and the digital signal D5 calculated according to the above-described equation (7). As shown in FIG. 14, the line 1404 has good linearity with respect to the line 1401. When the gain of the amplification circuit 104 is set to ¼ (that is, when an H-level signal is held in a corresponding memory 109D), the signal processing circuit 111 outputs the digital signal D5 as the aforementioned digital signal D.

Figure 13:
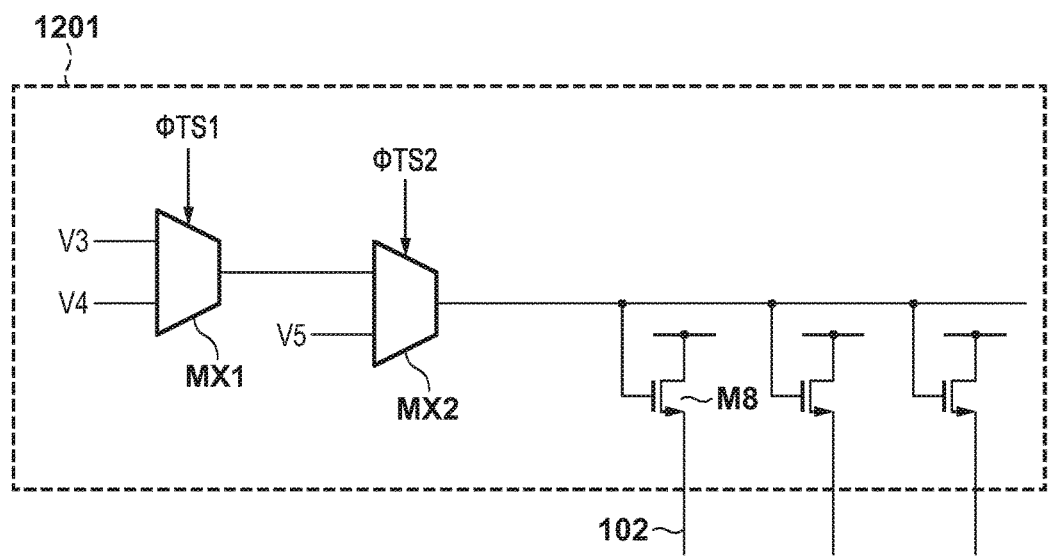
FIG. 13 is a diagram for explaining an example of the circuit arrangement of the solid state image sensor of FIG. 12.

An example of the circuit arrangement of the test signal generation circuit 1201 will be described with reference to FIG. 13. The test signal generation circuit 1201 includes a multiplexer MX1 controlled by a control signal ϕTS1, a multiplexer MX2 controlled by a control signal ϕTS2, and transistors M8 connected to the vertical lines 102 of the respective columns. Each transistor M8 is an NMOS transistor. The source of each transistor M8 is connected to the vertical line 102 and the drain of each transistor M8 is connected to the power source. Each transistor M8 controls the voltage of the vertical line 102 according to a gate voltage controlled by the multiplexer MX2. A voltage V5 and the output from the multiplexer MX1 are supplied to the multiplexer MX2. Voltages V3 and V4 are supplied to the multiplexer MX1. The multiplexer MX1 outputs the voltage V3 when the control signal ϕTS1 is L level and outputs the voltage V4 when the control signal ϕTS1 is H level. The signal supplied by the test signal generation circuit 1201 to each vertical line 102 when the voltage V3 is supplied to the gate of the corresponding transistor 8 is called a first test signal. The signal supplied by the test signal generation circuit 1201 to each vertical line 102 when the voltage V4 is supplied to the gate of the corresponding transistor 8 is called a second test signal. The first test signal and the second test signal have different values from each other.

When the control signal ϕTS2 changes to L level, the multiplexer MX2 selects the voltage V and supplies the voltage V5 to the gate of each transistor M8. On the other hand, when the control signal ϕTS2 changes to H level, the multiplexer MX2 selects the output from the multiplexer MX1 and outputs the voltage V3 or V4 to the gate of each transistor M8. In the correction calculation operation, the control signal ϕTS2 changes to H level, and a voltage according to the voltage V3 or V4 is supplied to each vertical line 102 as the vertical line signal Vvl. In the pixel signal readout operation, the control signal φTS2 changes to L level, and each vertical line 102 is clipped according to the voltage V5. The test signal generation circuit 1201 has such a clipping function to prevent excessive voltage reduction in each vertical line 102 generated when the pixel signal level is locally increased, and a smear suppression effect is obtained.

Figure 15:
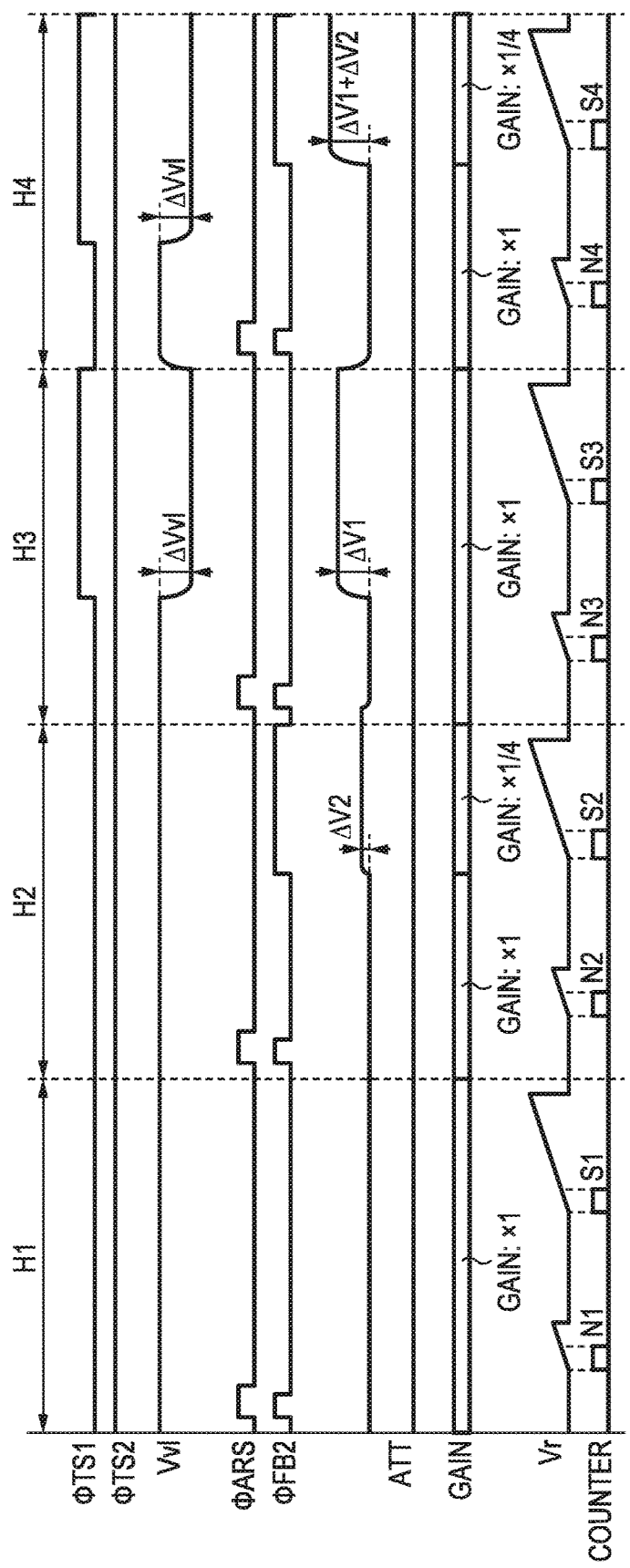
FIG. 15 is a timing chart for explaining a correction value calculation operation of the solid-state image sensor of FIG. 12.

The correction value calculation operation will be described with reference to the timing chart of FIG. 15. In the correction value calculation operation of the second embodiment, a gain correction value is also calculated as well as offset correction value. FIG. 15 describes an operation for calculating a correction value for a single amplification circuit 104. This correction value is used for the plurality of pixels 100 commonly connected to the amplification circuit 104. A vertical scanning circuit 103 maintains, throughout the periods shown in FIG. 15, the control signal φPSEL supplied to all calculation pixels 100 at L level.

The correction value calculation operation is formed from operations performed in successive periods H1 to H4. The operation performed in each period is the same as the operation performed in the period H1 of FIG. 5. Hence, differences will be mainly described.

In the period H1, in a state in which the vertical line signal Vvl is the first test signal and its gain is set to 1, a digital value N1 is generated. Subsequently, in a state in which the vertical line signal Vvl is the first test signal and its gain is set to 1, a digital value S1 is generated. In the period H2, in a state in which the vertical line signal Vvl is the first test signal and its gain is set to 1, a digital value N2 is generated. Subsequently, in a state in which the vertical line signal Vvl is the first test signal and its gain is set to ¼, a digital value S2 is generated. In the period H3, in a state in which the vertical line signal Vvl is the first test signal and its gain is set to 1, a digital value N3 is generated. Subsequently, in a state in which the vertical line signal Vvl is the second test signal and its gain is set to 1, a digital value S3 is generated. In the period H4, in a state in which the vertical line signal Vvl is the first test signal and its gain is set to 1, a digital value N4 is generated. Subsequently, in a state in which the vertical line signal Vvl is the second test signal and its gain is set to ¼, a digital value S4 is generated. The signal processing circuit 111 appropriately reads out these digital values from the corresponding memory unit 109 to the memory 112.

The signal processing circuit 111 calculates the correction coefficient b, the gain correction value $\beta_G$, and the offset correction value $\alpha_G$ by $$b=\{(S3-N3)-(S1-N1)\}/\{(S4-N4)/G-(S2-N2)/G\} \qquad (8)$$

$$\beta_G=b/G \qquad (9)$$

$$\alpha_G=b(S2-N2)/G-(S1-N1) \qquad (10)$$

where G (¼ in the above-described example) is the changed gain set in the amplification circuit 104. The signal processing circuit 111 stores the gain correction value $\beta_G$ and the offset correction value $\alpha_G$ calculated in this manner in the memory 112. In place of equation (10), the signal processing circuit 111 can calculate the offset correction value $\alpha_G$ by $$\alpha_G=b(S4-N4)/G-(S3-N3) \qquad (11)$$

In this embodiment, a solid-state image sensor that has a more favorable linearity can be implemented by correcting the gain of the amplification circuit based on the amplified signal Vamp. The first to third modifications of the first embodiment may be combined with the second embodiment.

In each aforementioned embodiment, a case in which the pixel value is corrected by calculating the correction value for each pixel column has been described. Instead, an average value or a median value may be calculated from the correction values calculated for each pixel column, and this value can be commonly used for correcting the pixel values from the plurality of pixel columns. Additionally, in each aforementioned embodiment, a case in which the amplification circuit 104 switches between two types of gains has been described. However, the present invention is not limited to this, and the amplification circuit 104 may switch among three or more types of gains. In this case, the offset correction value and the gain correction value are set for each of the plurality of gains.

Third Embodiment

Figure 16:
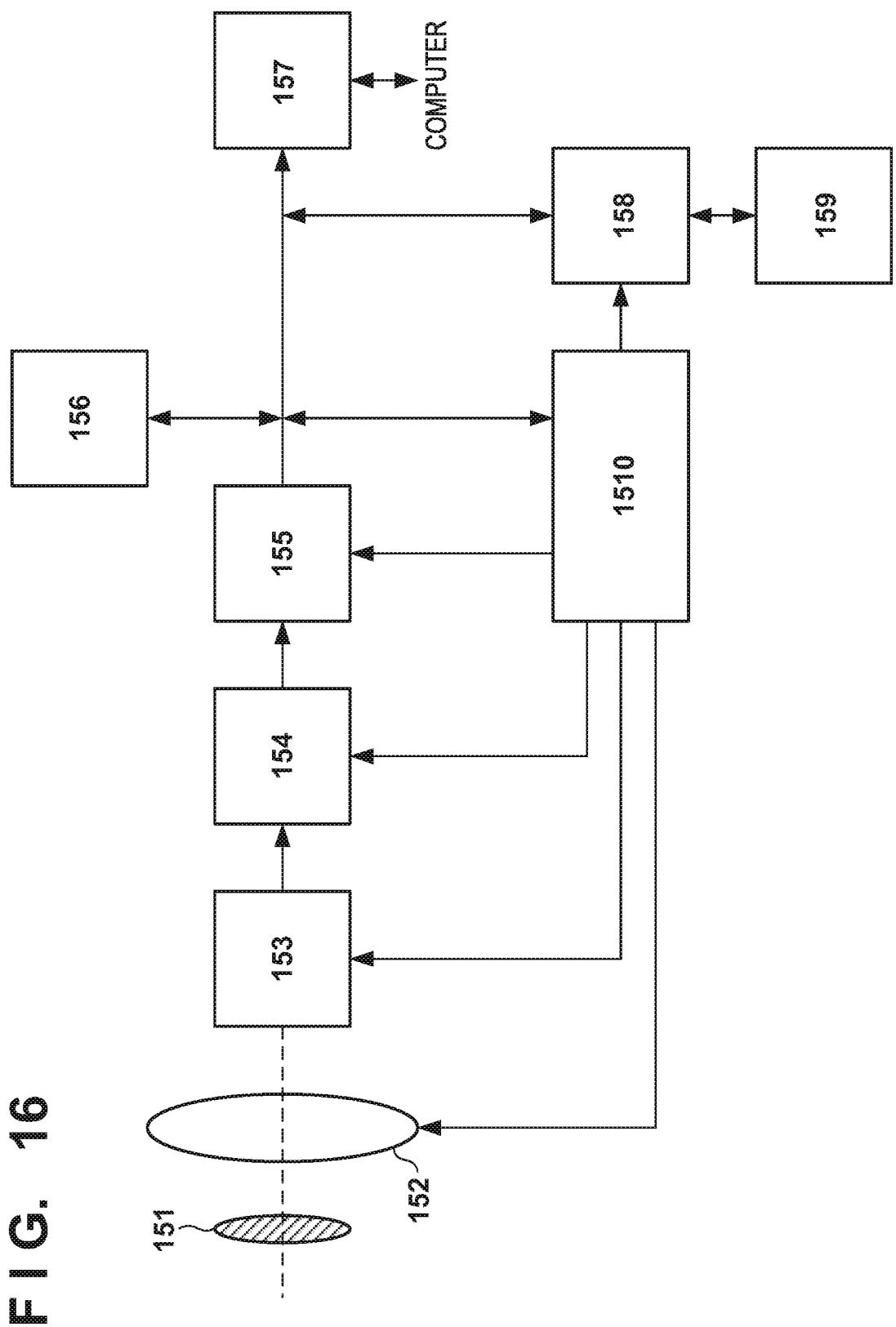
FIG. 16 is a view for explaining an example of the arrangement of an image sensing system according to a third embodiment.

An image sensing system according to the third embodiment will be described with reference to FIG. 16. In FIG. 16, the image sensing system includes a barrier 151 for lens protection, a lens 152 that causes an optical image of an object to be formed on an image sensor 154, and an aperture 153 to make the light amount which passes through the lens 152 variable. The image sensing system further includes a signal processing unit 155 that processes signals output from the image sensor 154. The signal output from the image sensor 154 is an image sensing signal for generating an image obtained by capturing an object. The signal processing unit 155 performs, as needed, various corrections and compressions on the image sensing signal output from the image sensor 154, and generates an image. The lens 152 and the aperture 153 form an optical system that focuses light to the image sensor 154.

The image sensing system exemplified in FIG. 16 further includes a buffer memory unit 156 for temporarily storing image data and an external interface unit 157 for communicating with an external computer. The image sensing system further includes a detachable storage medium 159, such as a semiconductor memory or the like, for storing or reading out the image sensing data, and a storage medium control interface 158 for storing or reading out the storage medium 159. The image sensing system further includes a control/computation unit 1510 that controls the various computations and the entire digital still camera.

The image sensing system shown in FIG. 16 can have a configuration in which the signal processing unit 155, provided on a semiconductor substrate separate from the image sensor 154, includes the signal processing circuit 111 described in the first and second embodiments. In this configuration, the signal processing unit 155 is the signal processing unit that includes the correction unit. Even if this configuration is used, the image sensing system according to this third embodiment can obtain the same effects as those described in the first and second embodiments. As another configuration, a configuration in which the control/computation unit 1510, provided on a semiconductor substrate separate from the image sensor 154, includes the signal processing circuit 111 described in the first and second embodiments is also possible. In the case of this configuration, the control/computation unit 1510 is the signal processing unit that includes the correction unit.

Although the above description of this embodiment assumes a configuration in which the signal processing circuit 111 described in the first and second embodiments is provided outside the image sensor 154, it may also be a configuration in which only some of the functions are provided outside the image sensor 154. For example, the signal processing circuit 111 outputs S1−N1, S2−N2, S3−N3, and S4−N4 to the outside of the image sensor 154. The signal processing unit 155 or the control/computation unit 1510 calculates the gain correction value $\beta_G$ and the offset correction value $\alpha_G$. The signal processing unit 155 or the control/computation unit 1510 returns the obtained gain correction value $\beta_G$ and offset correction value $\alpha_G$ to the signal processing circuit 111 included in the image sensor 154. The signal processing circuit 111 of the image sensor 154 uses these correction values to perform the pixel signal readout operation. Even if this configuration is used, the same effects as those described in the first and second embodiments can be obtained.

The semiconductor substrate on which the image sensor 154 is provided and the separate semiconductor substrate on which the signal processing unit 155 or the control/computation unit 1510 as the correction unit is provided may be stacked.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2015-207496, filed Oct. 21, 2015 and 2016-164065, filed Aug. 24, 2016 which are hereby incorporated by reference herein in their entirety.

What is claimed is:

1. A solid-state image sensor comprising:
   a pixel configured to generate a pixel signal corresponding to incident light;
   an amplification circuit configured to amplify the pixel signal;
   a setting circuit configured to set a gain of the amplification circuit based on a comparison result between a threshold and the pixel signal amplified by the amplification circuit; and
   a correction circuit configured to correct the pixel signal, which is amplified by a gain set by the setting circuit, by using a first correction value and a second correction value, the first correction value being a value corresponding to a gain error and the second correction value being a value corresponding to an offset of the amplification circuit in the gain.

2. The sensor according to claim 1, wherein the amplification circuit changes the gain while amplifying the pixel signal.

3. The sensor according to claim 1, wherein
   the solid-state image sensor includes a plurality of pixels, each pixel configured to generate a pixel signal corresponding to incident light, and
   the setting circuit sets the gain of the amplification circuit for each pixel.

4. The sensor according to claim 3, wherein
   the plurality of pixels are arranged to form a plurality of columns,
   the sensor includes a plurality of amplification circuits, each amplification circuit being configured to amplify the pixel signal from a corresponding column of pixels, and
   the correction circuit corrects one of a plurality of pixel signals amplified by one of the plurality of amplification circuits, by using the first correction value and the second correction value, and corrects another one of the plurality of pixel signals amplified by another one of the plurality of amplification circuits, by using the first correction value and the second correction value each of which is used for a correction of the one of the plurality of pixel signals.

5. The sensor according to claim 1, further comprising:
   an A/D conversion circuit configured to convert the amplified pixel signal into a digital value,
   wherein the correction circuit corrects the pixel signal converted into a digital value.

6. The sensor according to claim 1, wherein
   the amplification circuit amplifies, by a first gain, a pixel reset signal supplied from the pixel in a reset state,
   when the amplification circuit is set to the first gain by the setting circuit, the correction circuit corrects, using the pixel reset signal amplified by the first gain, the pixel signal amplified by the first gain, and
   when the amplification circuit is set to a second gain different from the first gain by the setting circuit, the correction circuit corrects, using the first correction value, the second correction value, and the pixel reset signal amplified by the first gain, the pixel signal amplified by the second gain.

7. The sensor according to claim 6, wherein the correction circuit corrects the pixel signal according to $$\beta \times (S-N) - \alpha$$

where S is a value of the pixel signal amplified by the second gain, N is a value of the pixel reset signal amplified by the first gain, $\beta$ is the first correction value, and $\alpha$ is the second correction value.

8. The sensor according to claim 1, wherein
   the amplification circuit generates a plurality of amplified test signals by amplifying a test signal using each of a plurality of gains, and
   the correction circuit determines the second correction value based on the plurality of amplified test signals.

9. The sensor according to claim 8, wherein the test signal is a signal supplied from the pixel in a reset state to the amplification circuit.

10. The sensor according to claim 1, wherein
    the amplification circuit generates a plurality of amplified test signals by amplifying a first test signal and a second test signal using each of a plurality of gains, the second test signal having a value different from the first test signal, and
    the correction circuit determines the first correction value based on the plurality of amplified test signals.

11. The sensor according to claim 1, further comprising:
    a memory configured to hold the first correction value and the second correction value,
    wherein the correction circuit corrects the amplified pixel signal by using the first correction value and the second correction value read out from the memory.

12. The sensor according to claim 1, wherein the setting circuit determines whether the amplification circuit should change the gain based on the comparison result between the threshold and the amplified pixel signal.

13. The sensor according to claim 12, wherein the amplification circuit reduces the gain if the setting circuit determines that the amplification circuit should change the gain.

14. The sensor according to claim 1, wherein the setting circuit clips the amplified pixel signal.

15. A camera comprising:
    a solid-state image sensor; and a signal processing unit configured to process a pixel value obtained by the solid-state image sensor,
wherein the sensor comprises:
a pixel configured to generate a pixel signal corresponding to incident light;
an amplification circuit configured to amplify the pixel signal;
a setting circuit configured to set a gain of the amplification circuit based on a comparison result between a threshold and the pixel signal amplified by the amplification circuit; and
a correction circuit configured to correct the pixel signal, which is amplified by a gain set by the setting circuit, by using a first correction value and a second correction value, the first correction value being a value corresponding to a gain error and the second correction value being a value corresponding to an offset of the amplification circuit in the gain.

16. An image sensing system comprising:
a solid-state image sensor that includes
  a pixel configured to generate a pixel signal corresponding to incident light,
  an amplification circuit configured to amplify the pixel signal, and
  a setting circuit configured to set a gain of the amplification circuit based on a comparison result between a threshold and the pixel signal amplified by the amplification circuit; and
a correction circuit configured to obtain a first correction value and a second correction value for correcting the pixel signal amplified by a gain set by the setting circuit,
wherein the first correction value is a value corresponding to a gain error, and
the second correction value is a value corresponding to an amplification circuit offset in the gain.

17. The system according to claim 16, wherein
the solid-state image sensor further includes a signal processing circuit to which the first correction value and the second correction value are input from the correction circuit, and
the signal processing circuit corrects, by using the first correction value and the second correction value, the pixel signal amplified by the gain set by the setting circuit.

18. The system according to claim 16, wherein
the solid-state image sensor is provided on a first semiconductor substrate, and
the correction circuit is provided on a second semiconductor substrate different from the first semiconductor substrate.

19. The system according to claim 18, wherein the first semiconductor substrate is stacked on the second semiconductor substrate.

20. A method of controlling a solid-state image sensor that includes a pixel configured to generate a pixel signal corresponding to incident light, and an amplification circuit configured to amplify the pixel signal, the method comprising:
setting a gain of the amplification circuit based on a comparison result between a threshold and the pixel signal amplified by the amplification circuit; and
correcting the pixel signal, which is amplified by a gain set by the setting circuit, by using a first correction value and a second correction value, the first correction value being a value corresponding to a gain error, and the second correction value being a value corresponding to an amplification circuit offset in the gain.

* * * * *